US010461470B2

(12) United States Patent
Consoli et al.

(10) Patent No.: US 10,461,470 B2
(45) Date of Patent: Oct. 29, 2019

(54) CIRCUIT CARD ASSEMBLIES FOR A COMMUNICATION SYSTEM

(71) Applicant: TE CONNECTIVITY CORPORATION, Berwyn, PA (US)

(72) Inventors: John Joseph Consoli, Harrisburg, PA (US); Matthew Jeffrey Sypolt, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/945,812

(22) Filed: Apr. 5, 2018

(65) Prior Publication Data

US 2019/0252826 A1    Aug. 15, 2019

Related U.S. Application Data

(60) Provisional application No. 62/630,547, filed on Feb. 14, 2018.

(51) Int. Cl.
*H01R 13/6585* (2011.01)
*H01R 13/629* (2006.01)
(Continued)

(52) U.S. Cl.
CPC ... *H01R 13/62994* (2013.01); *H01R 12/7064* (2013.01); *H01R 12/737* (2013.01);
(Continued)

(58) Field of Classification Search
CPC ...... H01R 9/096; H01R 12/52; H01R 13/658; H01R 13/6585; H01R 13/6586;
(Continued)

(56) References Cited

U.S. PATENT DOCUMENTS

| 3,587,029 A | 6/1971 | Knowles |
| 4,560,221 A | 12/1985 | Olsson |

(Continued)

FOREIGN PATENT DOCUMENTS

| EP | 2346117 A2 | 7/2011 |
| EP | 2451262 A2 | 5/2012 |

(Continued)

OTHER PUBLICATIONS

Kerridge et al., 'Fast Backplane Connectors Disguise Digital Transmission Lines,' (Texas Instrument), Reed Business Information, Highlands Ranch, Co, US, vol. 42, No. Europe, May 8, 1997, XP000724062.

(Continued)

*Primary Examiner* — Abdullah A Riyami
*Assistant Examiner* — Justin M Kratt

(57) ABSTRACT

A circuit card assembly for a communication system includes a PCB having a slot receiving a second PCB of a second circuit card assembly in a board loading direction. An electrical connector is mounted to the PCB having a receptacle housing and a mating housing movable within the receptacle housing in a connector loading direction along a connector loading axis parallel to the board loading direction. The mating housing is movable in the receptacle housing in a connector mating direction along a connector mating axis perpendicular to the connector loading axis. Contacts of the electrical connector are mated with contacts of the second electrical connector in a contact mating direction parallel to the connector mating axis.

20 Claims, 15 Drawing Sheets

(51) Int. Cl.

| | | |
|---|---|---|
| *H05K 1/14* | (2006.01) | |
| *H05K 1/18* | (2006.01) | |
| *H01R 12/73* | (2011.01) | |
| *H05K 7/14* | (2006.01) | |
| *H01R 13/502* | (2006.01) | |
| *H01R 12/70* | (2011.01) | |
| *H01R 13/6586* | (2011.01) | |
| *H01R 13/6594* | (2011.01) | |
| *H01R 12/52* | (2011.01) | |
| *H01R 13/6587* | (2011.01) | |
| *H01R 13/658* | (2011.01) | |

(52) U.S. Cl.
CPC ..... *H01R 13/502* (2013.01); *H01R 13/62938* (2013.01); *H01R 13/62955* (2013.01); *H01R 13/62966* (2013.01); *H05K 1/14* (2013.01); *H05K 1/181* (2013.01); *H05K 7/1417* (2013.01); *H01R 12/52* (2013.01); *H01R 13/658* (2013.01); *H01R 13/6585* (2013.01); *H01R 13/6586* (2013.01); *H01R 13/6587* (2013.01); *H01R 13/6594* (2013.01); *H05K 2201/048* (2013.01); *H05K 2201/09063* (2013.01); *H05K 2201/10189* (2013.01)

(58) Field of Classification Search
CPC .............. H01R 23/688; H01R 13/6587; H01R 13/6594; H01R 23/6873; H01R 23/7073
USPC ........ 439/65, 607.09, 607.11, 607.4, 607.23, 439/607.05, 607.08
See application file for complete search history.

(56) References Cited

U.S. PATENT DOCUMENTS

| | | | |
|---|---|---|---|
| 5,114,353 A * | 5/1992 | Sample | H01R 23/68 361/791 |
| 5,676,559 A | 10/1997 | Laub et al. | |
| 6,267,604 B1 * | 7/2001 | Mickievicz | H01R 23/6873 439/108 |
| 6,796,822 B2 | 9/2004 | Sato et al. | |
| 6,918,775 B2 | 7/2005 | Korsunsky et al. | |
| 7,086,866 B1 | 8/2006 | Folan et al. | |
| 7,322,834 B2 | 1/2008 | Hu et al. | |
| 7,326,092 B2 | 2/2008 | Fedder et al. | |
| 7,435,095 B1 | 10/2008 | Yi | |
| 7,540,744 B1 | 6/2009 | Minich | |
| 7,708,578 B1 | 5/2010 | Lenox | |
| 7,771,207 B2 | 8/2010 | Hamner et al. | |
| 7,789,668 B1 | 9/2010 | Hamner et al. | |
| 7,824,187 B1 | 11/2010 | Yi | |
| 7,918,683 B1 | 4/2011 | Hamner et al. | |
| 7,988,457 B1 | 8/2011 | Morgan | |
| 8,113,851 B2 | 2/2012 | Hamner et al. | |
| 8,199,511 B2 | 6/2012 | Kim et al. | |
| 8,376,766 B1 | 2/2013 | Huettner et al. | |
| 8,512,081 B2 | 8/2013 | Stokoe | |
| 8,684,610 B2 | 4/2014 | Nichols et al. | |
| 9,551,625 B2 | 1/2017 | Brugger | |
| 9,608,371 B2 | 3/2017 | Bonzom et al. | |
| 9,608,382 B2 | 3/2017 | McClellan et al. | |
| 9,917,406 B1 | 3/2018 | Iwasaki et al. | |
| 2002/0071259 A1 | 6/2002 | Roos | |
| 2005/0064733 A1 | 3/2005 | Korsunsky et al. | |
| 2005/0070136 A1 | 3/2005 | Korsunsky et al. | |
| 2005/0181637 A1 | 8/2005 | Williams et al. | |
| 2007/0184676 A1 | 8/2007 | Minich | |
| 2008/0045087 A1 | 2/2008 | Yi et al. | |
| 2014/0065849 A1 | 3/2014 | Kida et al. | |
| 2016/0006150 A1 | 1/2016 | Bachmutsky et al. | |
| 2018/0040989 A1 | 2/2018 | Chen | |
| 2018/0261941 A1 | 9/2018 | Consoli et al. | |

FOREIGN PATENT DOCUMENTS

| | | |
|---|---|---|
| JP | 2003044794 A | 2/2003 |
| TW | M537321 U | 2/2017 |
| WO | 2007092113 A2 | 8/2007 |

OTHER PUBLICATIONS

Co-pending U.S. Appl. No. 15/945,821, filed Apr. 5, 2018.
Co-pending U.S. Appl. No. 15/945,802, filed Apr. 5, 2018.
Co-pending U.S. Appl. No. 15/945,787, filed Apr. 5, 2018.
Co-pending U.S. Appl. No. 15/945,767, filed Apr. 5, 2018.
Co-pending U.S. Appl. No. 15/945,775, filed Apr. 5, 2018.

* cited by examiner

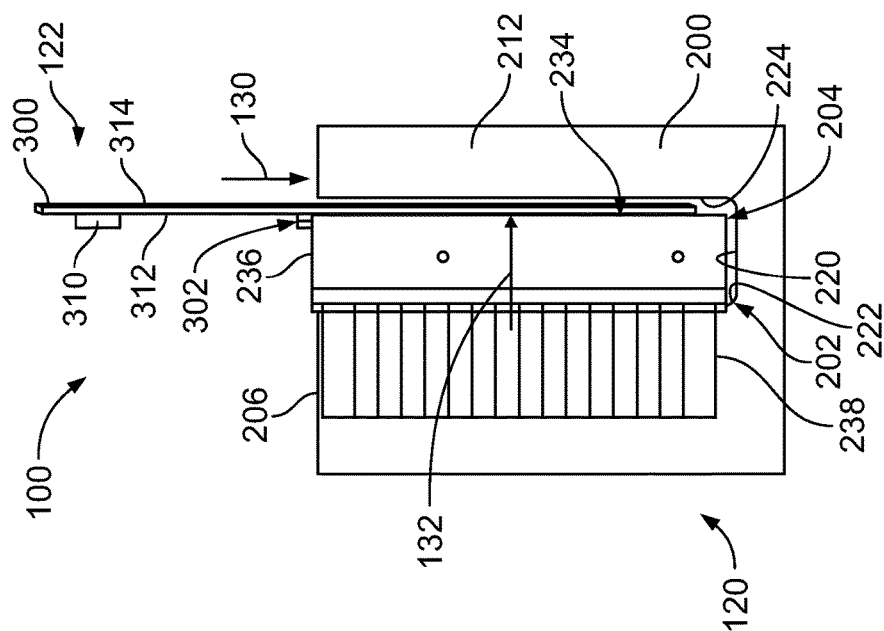
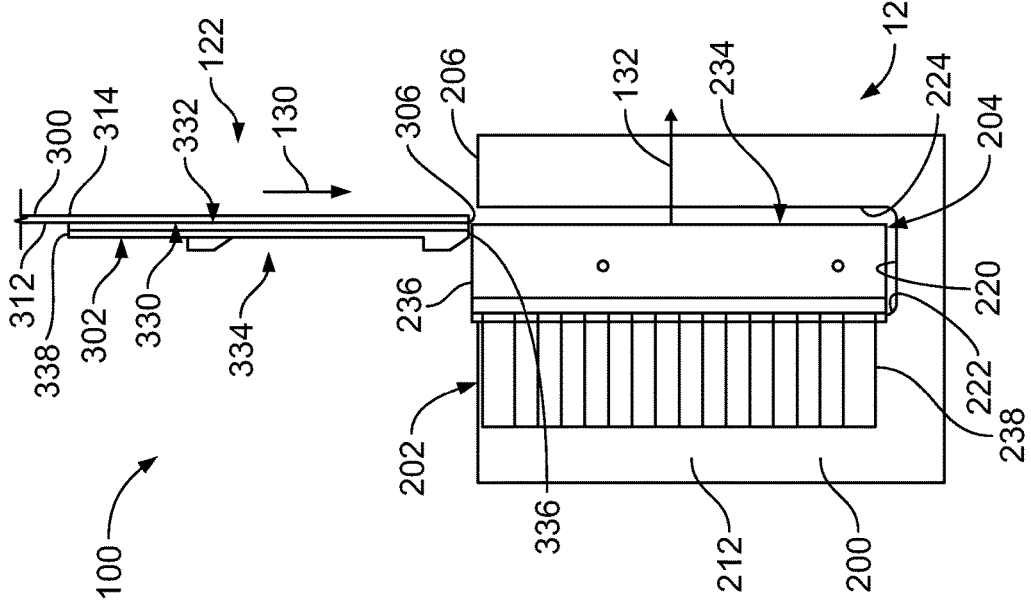

CIRCUIT CARD ASSEMBLIES FOR A COMMUNICATION SYSTEM

CROSS REFERENCE TO RELATED APPLICATIONS

This application claims benefit to U.S. Provisional Application No. 62/630,547, filed Feb. 14, 2018, titled "CIRCUIT CARD ASSEMBLIES FOR A COMMUNICATION SYSTEM", the subject matter of which is herein incorporated by reference in its entirety.

BACKGROUND OF THE INVENTION

The subject matter herein relates generally to circuit card assemblies for communication systems.

Communication systems are in use in various applications, such as network switches. The communication systems include various circuit cards, such as backplanes and/or daughtercards, which are coupled together to electrically connect various circuits. For example, the circuit cards include electrical connectors that are mated to electrical connectors of one or more other circuit cards. Some communication systems use a backplane or midplane that is perpendicular to the mating direction of the daughtercards. However, such backplanes or midplanes block airflow through the communication system leading to overheating of components or limiting operating speeds to avoid overheating.

Other communication systems arrange both circuit cards parallel to the mating direction to allow airflow through the system. The circuit cards are typically oriented perpendicular to each other (for example, horizontally and vertically). The electrical connectors are provided at edges of both circuit cards and direct mate to each other. Conventional communication systems utilize right angle electrical connectors on both cards that direct mate with each other in an orthogonal orientation. The mating interfaces of the electrical connectors are parallel to the mating edges of the circuit cards such that the electrical connectors are mated in a direction parallel to the mating direction of the circuit cards. However, such right angle electrical connectors are expensive to manufacture and occupy a large amount of space in the system, thus blocking airflow through the system. Furthermore, adding density to the system in the form of a greater number of signal contacts increases the size of the connector in at least one direction, further blocking airflow through the system.

A need remains for a cost effective and reliable communication system allowing airflow through the communication system for cooling the electrical components.

BRIEF DESCRIPTION OF THE INVENTION

In one embodiment, a circuit card assembly is provided for a communication system having a PCB having a first surface and a second surface and a mating edge between the first and second surfaces. The PCB has a slot extending inward from the mating edge configured to receive a second PCB of a second circuit card assembly in a board loading direction perpendicular to the mating edge. The PCB has a mounting area on the first surface adjacent the slot. An electrical connector is mounted to the first surface at the mounting area and is configured for mating with a second electrical connector of the second circuit card assembly. The electrical connector has a receptacle housing fixed relative to the PCB and having a cavity. The electrical connector has a mating housing received in the cavity of the receptacle housing being movable relative to the receptacle housing. The electrical connector has contacts held by the mating housing and being movable relative to the receptacle housing with the mating housing. The contacts have mating interfaces configured for mating with contacts of the second electrical connector. The receptacle housing is configured to be coupled to the second electrical connector as the second PCB is loaded in the board loading direction. The mating housing is movable within the receptacle housing in a connector loading direction along a connector loading axis parallel to the board loading direction. The mating housing is movable in the receptacle housing in a connector mating direction along a connector mating axis perpendicular to the connector loading axis. The contacts of the electrical connector are mated with the contacts of the second electrical connector in a contact mating direction parallel to the connector mating axis.

In another embodiment, a circuit card assembly is provided for a communication system having a PCB having a first surface and a second surface and a mating edge between the first and second surfaces. The PCB has a slot extending inward from the mating edge configured to receive a second PCB of a second circuit card assembly in a board loading direction perpendicular to the mating edge. The PCB has a mounting area on the first surface adjacent the slot. An electrical connector is mounted to the first surface at the mounting area configured for mating with a second electrical connector of the second circuit card assembly. The electrical connector has a receptacle housing fixed relative to the PCB and having a cavity. The electrical connector has a mating housing received in the cavity of the receptacle housing being movable relative to the receptacle housing within the cavity. The electrical connector has contacts held by the mating housing being movable relative to the receptacle housing with the mating housing. The contacts have mating interfaces configured for mating with contacts of the second electrical connector. The electrical connector has a cam lever pivotably coupled between the receptacle housing and the mating housing. The cam lever is pivotably coupled to the receptacle housing about a pivot axis and the cam lever is axially fixed relative to the receptacle housing. The cam lever has a movable pusher received in an elongated slot in the mating housing and engaging the mating housing in the elongated slot. The mating housing is configured to be coupled to the second electrical connector as the second PCB is loaded in the board loading direction to move the mating housing relative to the receptacle housing in a connector loading direction along a connector loading axis parallel to the board loading direction. The cam lever engages the second electrical connector and is actuated by the second electrical connector to force the mating housing to move within the receptacle housing in a connector mating direction along a connector mating axis perpendicular to the connector loading axis. The contacts of the electrical connector are mated with the contacts of the second electrical connector in a contact mating direction parallel to the connector mating axis.

In a further embodiment, a communication system is provided including a first circuit card assembly having a first PCB and a first electrical connector mounted to the first PCB. The first electrical connector has a first mating end and first contacts at the first mating end. Each of the first contacts has a first mating interface. The first electrical connector has a receptacle housing and a mating housing received in the receptacle housing movable in the receptacle housing in a connector loading direction along a connector loading axis and movable in the receptacle housing in a connector mating direction along a connector mating axis perpendicular to the connector loading axis. The communication system includes a second circuit card assembly having a second PCB and a second electrical connector mounted to the second PCB. The second electrical connector has a second mating end and second contacts at the second mating end. Each of the second contacts has a second mating interface. The second electrical connector has a header housing holding the second contacts. At least one of the first PCB and the second PCB includes a slot receiving the other of the first PCB and the second PCB in a board loading direction along a board loading axis. The receptacle housing is coupled to the header housing in the board loading direction as the first PCB and the second PCB are mated. The mating housing engages the header housing and moves with the header housing in the connector loading direction as the header housing moves in the board loading direction. The mating housing is movable within the receptacle housing toward the header housing in the connector mating direction generally perpendicular to the board loading direction as the header housing moves in the board loading direction.

BRIEF DESCRIPTION OF THE DRAWINGS

FIG. 3 is a top view of a portion of the communication system showing the first circuit card assembly poised for mating with the second circuit card assembly.

FIG. 4 is a top view of a portion of the communication system showing the first circuit card assembly mated to the second circuit card assembly.

DETAILED DESCRIPTION OF THE INVENTION

Figure 1:
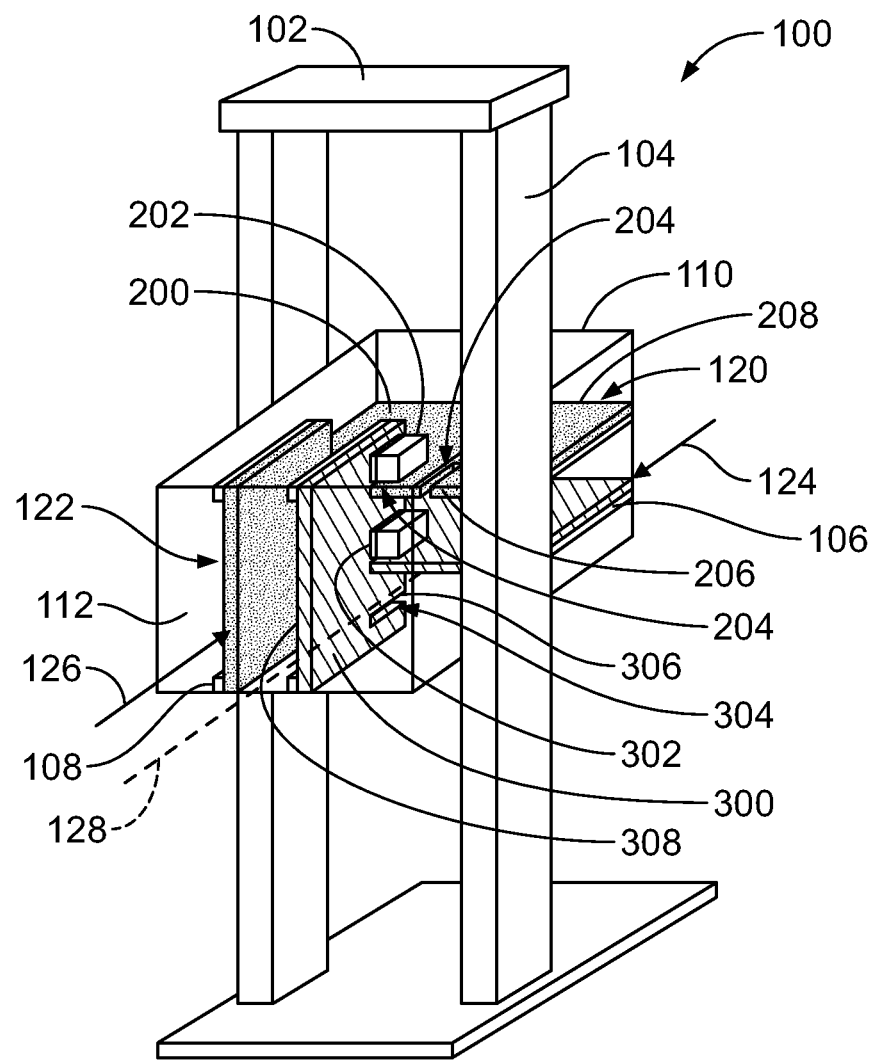
FIG. 1 illustrates a communication system formed in accordance with an exemplary embodiment.

FIG. 1 illustrates a communication system 100 formed in accordance with an exemplary embodiment. The communication system 100 includes a chassis 102 having a frame 104 configured to hold communication components, such as network components, such as circuit card assemblies. Optionally, the chassis 102 may include a cabinet (not shown) surrounding components of the communication system 100. In an exemplary embodiment, the frame 104 includes a plurality of racks 106, 108 for holding circuit card assemblies. For example, the communication system 100 may form part of a data center switch having one or more backplanes and/or daughter cards, such as line cards, switch cards or other types of circuit cards that may be electrically connected together.

In an exemplary embodiment, the communication system 100 includes a front end 110 and a rear end 112. The racks 106 are provided at the front end 110 and the racks 108 are provided at the rear end 112. One or more circuit card assemblies 120 may be received in the racks 106 at the front end 110 and one or more circuit card assemblies 122 may be received in the racks 108 at the rear end 112. The circuit card assemblies 120 may be referred to hereinafter as first circuit card assemblies 120 or front circuit card assemblies 120 to differentiate from the circuit card assemblies 122, which may be referred to hereinafter as second circuit card assemblies 122 and/or rear circuit card assemblies 122. In an exemplary embodiment, the circuit card assemblies 120, 122 are orthogonal to each other. For example, in the illustrated embodiment, the front circuit card assemblies 120 are oriented horizontally while the rear circuit card assemblies 122 are oriented vertically; however, other orientations are possible in alternative embodiments.

The front circuit card assemblies 120 are electrically connected to one or more of the rear circuit card assemblies 122. Optionally, the front circuit card assemblies 120 and/or the rear circuit card assemblies 122 may be removable from the corresponding racks 106, 108. The racks 106, 108 guide and position the circuit card assemblies 120, 122, respectively. For example, the racks 106 position the front circuit card assemblies 120 for mating with multiple rear circuit card assemblies 122 and the racks 108 position the rear circuit card assemblies 122 for mating with multiple front circuit card assemblies 120. The front circuit card assemblies 120 may be loaded into the frame 104 through the front end 110 while the rear circuit card assemblies 122 may be loaded into the frame 104 through the rear end 112. For example, the front circuit card assemblies 120 are configured to be loaded into corresponding racks 106 in a loading direction 124 and the rear circuit card assemblies 122 are configured to be loaded into corresponding racks 108 in a loading direction 126. The loading directions 124, 126 may be parallel to a loading axis 128.

The first circuit card assembly 120 includes a first printed circuit board (PCB) 200 and a first electrical connector 202 mounted to the first PCB 200. The first PCB 200 may include any number of the electrical connectors 202, such as one electrical connector 202 for electrically connecting to each corresponding second circuit card assembly 122. Optionally, the first PCB 200 may include one or more first slots 204 for receiving PCBs of corresponding second circuit card assemblies 122 when mated thereto.

Figure 2:
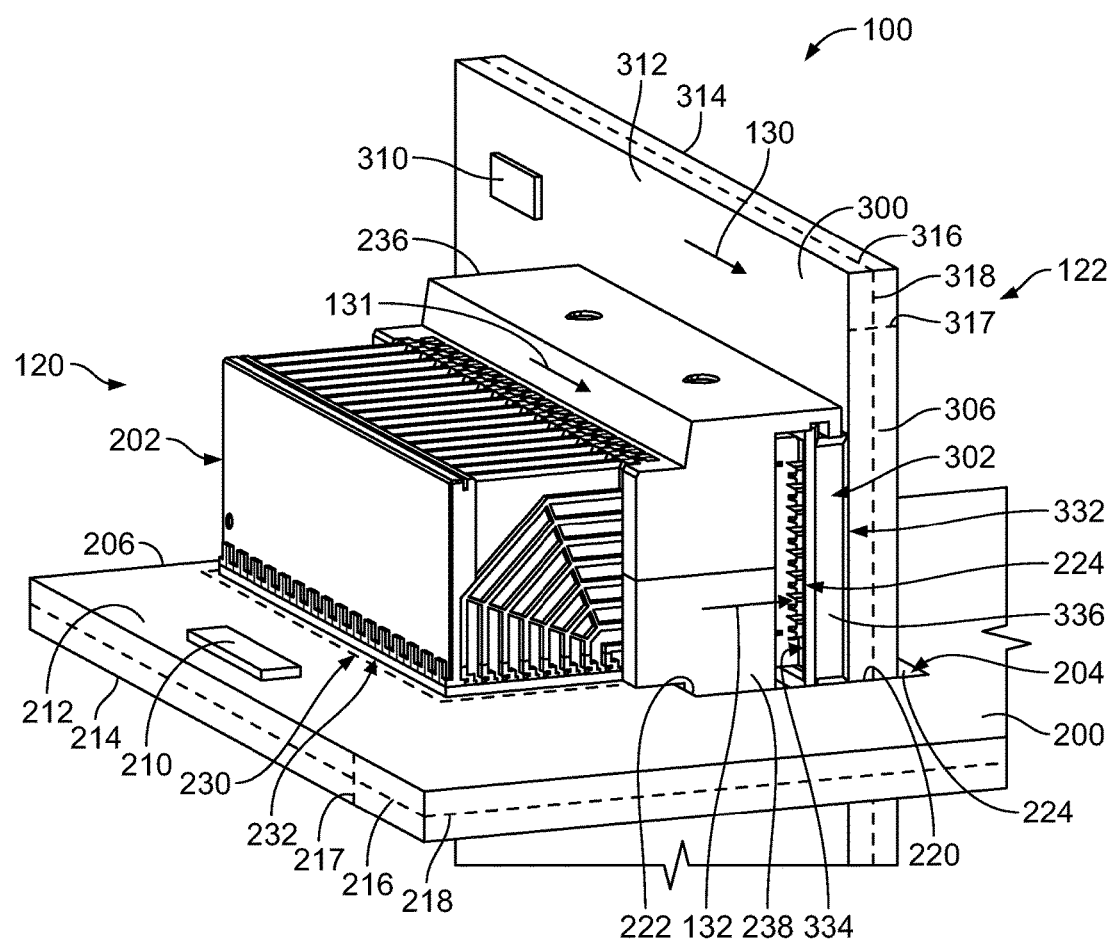
FIG. 2 is a perspective view of a portion of the communication system showing a first circuit card assembly coupled to a second circuit card assembly.

The first PCB 200 extends between a first mating edge 206 at a front of the PCB 200 and a rear edge 208 opposite the mating edge 206. Optionally, the rear edge 208 may include a handle or other feature for insertion and removal of the first circuit card assembly 120. The first PCB 200 may include one or more electrical components 210 (such as shown in FIG. 2) thereon. For example, the electrical components 210 may be processors, memory modules, batteries, fans, signal processing devices, and the like.

The second circuit card assembly 122 includes a second PCB 300 and a second electrical connector 302 mounted to the second PCB 300. The second PCB 300 may include any number of the electrical connectors 302, such as one electrical connector 302 for electrically connecting to each corresponding first circuit card assembly 120. The second PCB 300 extends between a second mating edge 306 at a front of the PCB 300 and a rear edge 308 opposite the mating edge 306. The first and second mating edges 206, 306 of the first and second PCBs 200, 300 interface with each other when the first and second circuit card assemblies 120, 122 are mated. For example, the fronts of the PCBs 200, 300 face each other and the rear edges 208, 308 face away from each other. Optionally, the rear edge 308 may include a handle or other feature for insertion and removal of the second circuit card assembly 122. The second PCB 300 may include one or more electrical components 310 (such as shown in FIG. 2) thereon. For example, the electrical components 310 may be processors, memory modules, batteries, fans, signal processing devices, and the like.

Optionally, the second PCB 300 may include one or more second slots 304 for receiving first PCBs 200 of corresponding first circuit card assemblies 120 when mated thereto. In various embodiments, both PCBs 200, 300 include the first and second slots 204, 304, respectively. In other various embodiments, only the first PCB 200 includes the first slots 204, whereas in other various embodiments, only the second PCB 300 includes the second slots 304.

The first slots 204 and/or the second slots 304 allow the first and second PCBs 200, 300 to be internested and overlapping such that the first and second electrical connectors 202, 302 are aligned for mating. For example, the first slots 204 and/or the second slots 304 allow the first and second PCBs 200, 300 to overlap to align mating ends of the first and second electrical connectors 202, 302 for mating. The arrangement allows the first and second electrical connectors 202, 302 to be mated in a mating direction perpendicular to the loading directions 124, 126. During mating, the first and second PCBs 200, 300 and the first and second electrical connectors 202, 302 may be loaded or mated together in a board loading direction 130 (FIG. 2) and at the end of the mating process the first and second electrical connectors 202, 302 may be mated in a connector mating direction 132 (FIG. 2) perpendicular to the board loading direction 130.

Having the first and second circuit card assemblies 122 internested and overlapped using the slot(s) 204, 304 allows the first and second electrical connectors 202, 302 to be elongated along the PCBs 200, 300 reducing one or more other dimensions of the electrical connectors 202, 302 (for example, a height and/or a width) allowing a greater amount of airflow through the communication system 100 (for example, from the front end 110 to the rear end 112 and/or from the rear end 112 to the front end 110. The density of contacts in the communication system 100 may be increased by increasing the length of the mating interfaces (e.g., in the loading direction), without increasing in other dimension, such as the height of the width, which does not negatively impact the airflow through the communication system because the height and the width dimensions are the same irrespective of the length. The arrangement may allow the PCBs 200, 300 to overlap to reduce one or more dimensions of the communication system 100, such as a front to rear length of the communication system 100.

Figure 5:
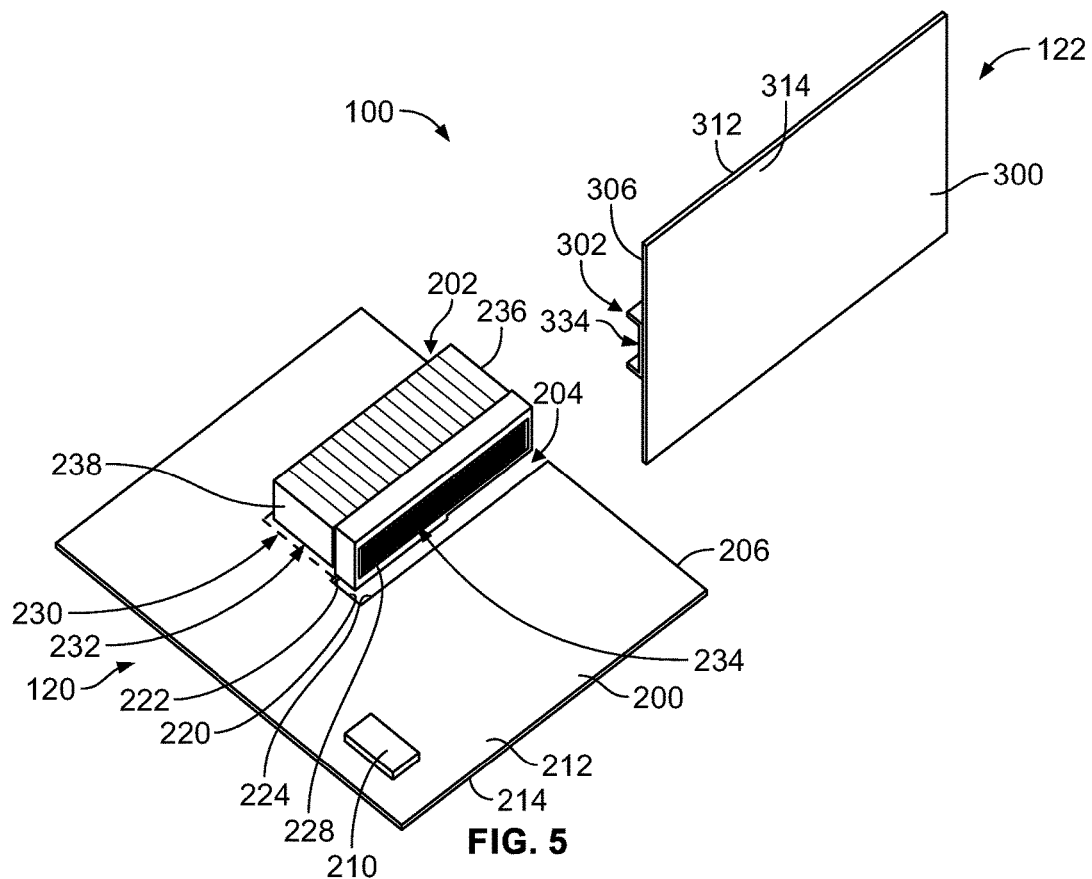
FIG. 5 is a perspective view of a portion of the communication system showing the first circuit card assembly and the second circuit card assembly poised for mating.

FIG. 2 is a perspective view of a portion of the communication system 100 showing the first circuit card assembly 120 coupled to the second circuit card assembly 122; however, it is noted that the first circuit card assembly 120 may be designed to be coupled to multiple circuit card assemblies 122 and/or the second circuit card assembly 122 may be designed to be coupled to multiple circuit card assemblies 120, such as in the arrangement illustrated in FIG. 1. FIG. 3 is a top view of a portion of the communication system 100 showing the first circuit card assembly 120 poised for mating to the second circuit card assembly 122. FIG. 4 is a top view of a portion of the communication system 100 showing the first circuit card assembly 120 coupled to the second circuit card assembly 122. FIG. 5 is a perspective view of a portion of the communication system 100 showing the first circuit card assembly 120 and the second circuit card assembly 122 poised for mating.

The terms "first", "second", etc. are used merely as labels to generally identify components of the first circuit card assembly 120 or the second circuit card assembly 122, respectively; however, such labels are not used exclusively with the circuit card assemblies 120, 122. Either or both of the circuit card assemblies 120, 122 may include any of the various components or elements described herein and some components may only be described with respect to either the circuit card assembly 120 or the circuit card assembly 122; however, the other of the circuit card assembly 120 or the circuit card assembly 122 may additionally include such components. Furthermore, the components may be described herein with or without the "first" label or the "second" label.

The first circuit card assembly 120 includes the first PCB 200 having the first slot 204 and the electrical connector 202 mounted to the PCB 200 proximate to the first slot 204. The PCB 200 includes a first surface 212 and a second surface 214 being the main surfaces of the PCB 200. In the illustrated embodiment, the first surface 212 is an upper surface and the second surface 214 is a lower surface; however, the PCB 200 may have other orientations in alternative embodiments. The first and second surfaces 212, 214 extend along a primary axis 216 and a secondary axis 218 perpendicular to the primary axis 216. The PCB 200 has a thickness between the first and second surfaces 212, 214 along a transverse axis 217 perpendicular to the primary and secondary axes 216, 218. In an exemplary embodiment, the primary and secondary axes 216, 218 are in a horizontal plane and the transverse axis 217 extends in a vertical direction; however, the PCB 200 may have other orientations in alternative embodiments. In an exemplary embodiment, the primary axis 216 extends between the mating edge 206 and the rear edge 208 (shown in FIG. 1). In an exemplary embodiment, the secondary axis 218 is parallel to the mating edge 206.

The first slot 204 extends entirely through the PCB 200 between the first and second surfaces 212, 214. The first slot 204 is open at the mating edge 206 to receive the second circuit card assembly 122. The first slot 204 extends a length along the primary axis 216 to an end edge 220 remote from the mating edge 206. The first slot 204 has a first side edge 222 and may include a second side edge 224, as in the illustrated embodiment, extending between the mating edge 206 and the end edge 220. Optionally, the side edges 222, 224 may be generally parallel to each other. Alternatively, the side edges 222, 224 may be nonparallel, such as to taper the first slot 204. For example, the first slot 204 may be wider near the mating edge 206 and narrower near the end edge 220. Optionally, the side edges 222, 224 may have chamfered lead-ins at the mating edge 206 to guide the second circuit card assembly 122 into the first slot 204. However, in alternative embodiments, the first slot 204 may be defined only by the end edge 220 and the first side edge 222.

The first PCB 200 includes a mounting area 230 for the electrical connector 202 on the first surface 212. The mounting area 230 is adjacent the first slot 204. For example, the mounting area 230 extends along the mating edge 206 a distance from the first slot 204 and extends along the first side edge 222 of the first slot 204 a distance from the mating edge 206. Optionally, the mounting area 230 may extend beyond the end edge 220 of the first slot 204. The electrical connector 202 is terminated to the PCB 200 at the mounting area 230. For example, contacts 228 that extend through the electrical connector 202 may be soldered to the PCB 200 at the mounting area 230. The mounting area 230 may include plated vias that receive compliant pins or solder tails of the contacts 228 of the electrical connector 202 for termination of the contacts 228 to the PCB 200. Optionally, at least a portion of the electrical connector 202 may extend beyond the first side edge 222 over the first slot 204 and/or at least a portion of the electrical connector 202 may extend forward of the mating edge 206 and/or at least a portion of the electrical connector 202 may extend rearward of the end edge 220. In other various embodiments, the PCB 200 may include more than one mounting area 230 adjacent the first slot 204 for receiving additional electrical connectors 202. For example, multiple electrical connectors 202 may be electrically connected to the same circuit card assembly 122. For example, additional electrical connectors 202 may be provided on both sides of the first slot 204 and/or both sides of the PCB 200.

The first electrical connector 202 is mounted to the PCB 200 at the mounting area 230. In the illustrated embodiment, the electrical connector 202 is a right angle connector having a mounting end 232 perpendicular to a mating end 234. For example, the mounting end 232 may be provided at a bottom of the electrical connector 202 and the mating end 234 may be provided at a side of the electrical connector 202. The electrical connector 202 extends between a front 236 and a rear 238 opposite the front 236. The mounting end 232 extends between the front 236 and the rear 238 at the bottom of the electrical connector 202. The mounting end 232 is mounted to the PCB 200. For example, the electrical connector 202 is mechanically and electrically terminated to the PCB 200 at the mounting end 232. The mating end 234 extends between the front 236 and the rear 238. In the illustrated embodiment, the mating end 234 generally faces the first slot 204 for interfacing with the second electrical connector 302 when the second circuit card assembly 122 is received in the first slot 204. The mating end 234 is configured to be mated to the mating electrical connector defined by the second electrical connector 302 when the second circuit card assembly 122 is received in the first slot 204.

In an exemplary embodiment, the mating end 234 is oriented generally vertically along the transverse axis 217 and extends parallel to the primary axis 216. The mating end 234 faces sideways rather than forward. For example, the mating end 234 is perpendicular to the mating edge 206 of the PCB 200. The front 236 is oriented generally vertically along the transverse axis 217 and extends parallel to the secondary axis 218. The front 236 may be positioned a first distance from the mating edge 206 (either forward of, rearward of or flush with the mating edge 206) and the rear 238 is positioned a second distance from the mating edge 206 greater than the first distance. The mating end 234 spans a majority of the distance between the front 236 and the rear 238. The front 236 is forward facing and, in the illustrated embodiment, is provided near the mating edge 206, such as generally flush with the mating edge 206.

The second circuit card assembly 122 includes the second PCB 300, which may or may not include a slot. In the illustrated embodiment, the PCB 300 does not include a slot. The PCB 300 includes a first surface 312 and a second surface 314 being the main surfaces of the PCB 300. In the illustrated embodiment, the first surface 312 defines a first side and the second surface 314 defines a second side of the PCB 300; however, the PCB 300 may have other orientations in alternative embodiments. The first and second surfaces 312, 314 extend along a primary axis 316 and a secondary axis 318 perpendicular to the primary axis 316. The PCB 300 has a thickness between the first and second surfaces 312, 314 along a transverse axis 317 perpendicular to the primary and secondary axes 316, 318. In an exemplary embodiment, the primary and secondary axes 316, 318 are in a vertical plane and the transverse axis 317 extends in a horizontal direction; however, the PCB 300 may have other orientations in alternative embodiments. In an exemplary embodiment, the primary axis 316 extends between the mating edge 306 and the rear edge 308 (shown in FIG. 1). In an exemplary embodiment, the secondary axis 318 is parallel to the mating edge 306.

In an exemplary embodiment, at least a portion of the PCB 300 is configured to be received in the first slot 204 and may at least partially fill the first slot 204. Such portion may engage the end edge 220, the first side edge 222 and/or the second side edge 224 of the first slot 204 when received therein.

The second PCB 300 includes a mounting area 330 for the electrical connector 302 on the first surface 312. The mounting area 330 extends from the mating edge 306 a distance. The electrical connector 302 is terminated to the PCB 300 at the mounting area 330. For example, contacts 328 of the electrical connector 302 may be soldered to the PCB 300 at the mounting area 330. The mounting area 330 may include plated vias that receive compliant pins or solder tails of the contacts 328 of the electrical connector 302 for termination of the contacts 328 to the PCB 300. Optionally, at least a portion of the electrical connector 302 may extend forward of the mating edge 306. In other various embodiments, the PCB 300 may include more than one mounting area 330 for receiving additional electrical connectors 302. For example, multiple electrical connectors 302 may be electrically connected to the same circuit card assembly 122.

The second electrical connector 302 is mounted to the PCB 300 at the mounting area 330. In the illustrated embodiment, the electrical connector 302 is a header connector having a mounting end 332 parallel to a mating end 334. For example, the mounting end 332 may be provided along one side of the electrical connector 302 and the mating end 334 may be provided at the opposite side of the electrical connector 302. Optionally, the mounting end 332 and the mating end 334 may be parallel to each other and non-coplanar. The electrical connector 302 extends between a front 336 (FIG. 2) and a rear 338 (FIG. 3) opposite the front 336. The mounting end 332 and the mating end 334 both extend between the front 336 and the rear 338. The mounting end 332 is mounted to the PCB 300. For example, the electrical connector 302 is mechanically and electrically terminated to the PCB 300 at the mounting end 332. In the illustrated embodiment, the mating end 334 is oriented for interfacing with the first electrical connector 202 when the second circuit card assembly 122 is received in the first slot 204.

In an exemplary embodiment, the mating end 334 is oriented generally vertically and extends parallel to the primary axis 316. The mating end 334 faces sideways rather than forward. For example, the mating end 334 is perpendicular to the mating edge 306 of the PCB 300. The front 336 is oriented generally vertically and extends parallel to the secondary axis 318. The front 336 may be positioned a first distance from the mating edge 306 (either forward of, rearward of or flush with the mating edge 306) and the rear 338 is positioned a second distance from the mating edge 306 greater than the first distance. The mating end 334 spans a majority of the distance between the front 336 and the rear 338. The front 336 is forward facing and, in the illustrated embodiment, is provided near the mating edge 306, such as generally flush with the mating edge 306.

When the first and second circuit card assemblies 120, 122 are mated, the first and second PCBs 200, 300 are internested and the second PCB 300 is received in the first slot 204. When mated, the first PCB 200 at least partially overlaps with the second PCB 300 to align the mating ends 234, 334 of the electrical connectors 202, 302. For example, the mating edges 206, 306 bypass each other as the second PCB 300 is received in the first slot 204. The front 336 of the second electrical connector 302 may be generally aligned with the rear 238 of the first electrical connector 202 and the front 236 of the first electrical connector 202 may be generally aligned with the rear 338 of the second electrical connector 302. During mating, the contacts 328 are moved in a board loading direction 130 (for example, parallel to the primary axis 316 of the PCB 300) along the mating end 234 of the first electrical connector 202 until generally aligned with the corresponding contacts 228 of the first electrical connector 202 and then the contacts 228 of the first electrical connector 202 are moved in a contact mating direction (for example, sideways or perpendicular to the board loading direction 130), with a portion of the first electrical connector 202, toward the second electrical connector 302 as the first and second electrical connectors 202, 302 are mated. For example, a portion of the first electrical connector 202 is moved toward the second electrical connector 302 to move the contacts 228 in the contact mating direction.

Figures 6, 7:
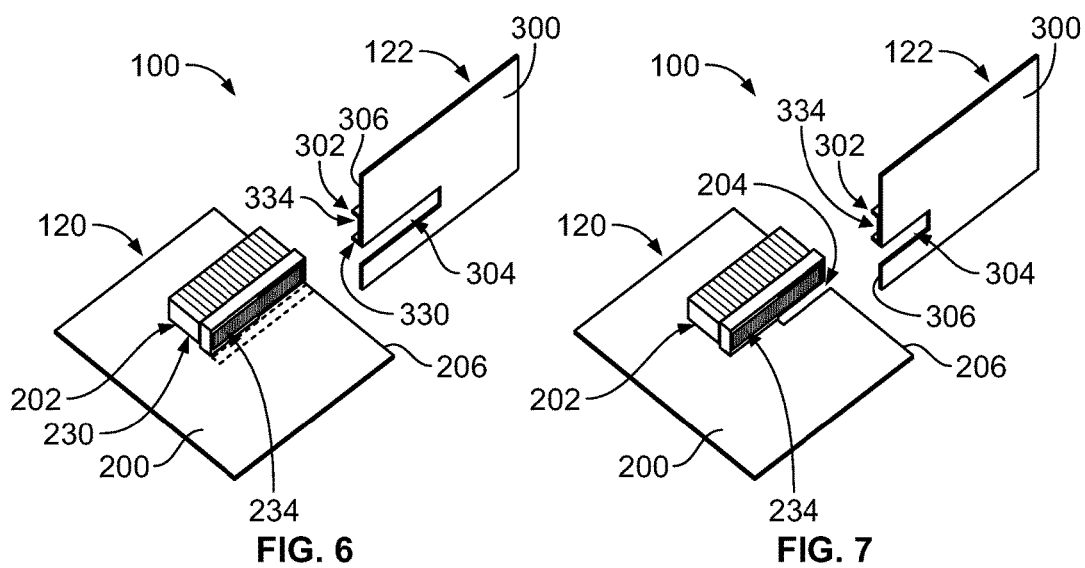
FIG. 6 is a perspective view of a portion of the communication system in accordance with an exemplary embodiment.
FIG. 7 is a perspective view of a portion of the communication system in accordance with an exemplary embodiment.

FIG. 6 is a perspective view of a portion of the communication system 100 in accordance with an exemplary embodiment. FIG. 6 shows the second circuit card assembly 122 with the second slot 304 and the first circuit card assembly 120 without the first slot 204 (shown in FIG. 5). Optionally, at least a portion of the first PCB 200 is configured to at least partially fill the second slot 304. The second electrical connector 302 is mounted to the mounting area 330 adjacent the second slot 304. When the first and second circuit card assemblies 120, 122 are mated, the first and second PCBs 200, 300 are internested with the first PCB 200 being received in the second slot 304. When mated, the first PCB 200 at least partially overlaps with the second PCB 300 to align the mating ends 234, 334 of the electrical connectors 202, 302. For example, the mating edges 206, 306 bypass each other as the first PCB 200 is received in the second slot 304.

FIG. 7 is a perspective view of a portion of the communication system 100 in accordance with an exemplary embodiment. FIG. 7 shows the first circuit card assembly 120 with the first slot 204 and the second circuit card assembly 122 with the second slot 304. When the first and second circuit card assemblies 120, 122 are mated, the first and second PCBs 200, 300 are internested with the first PCB 200 being received in the second slot 304 and with the second PCB 300 being received in the first slot 204. When mated, the first PCB 200 at least partially overlaps with the second PCB 300 to align the mating ends 234, 334 of the electrical connectors 202, 302. For example, the mating edges 206, 306 bypass each other as the PCBs 200, 300 are received in the second and first slots 304, 204, respectively.

Figure 8:
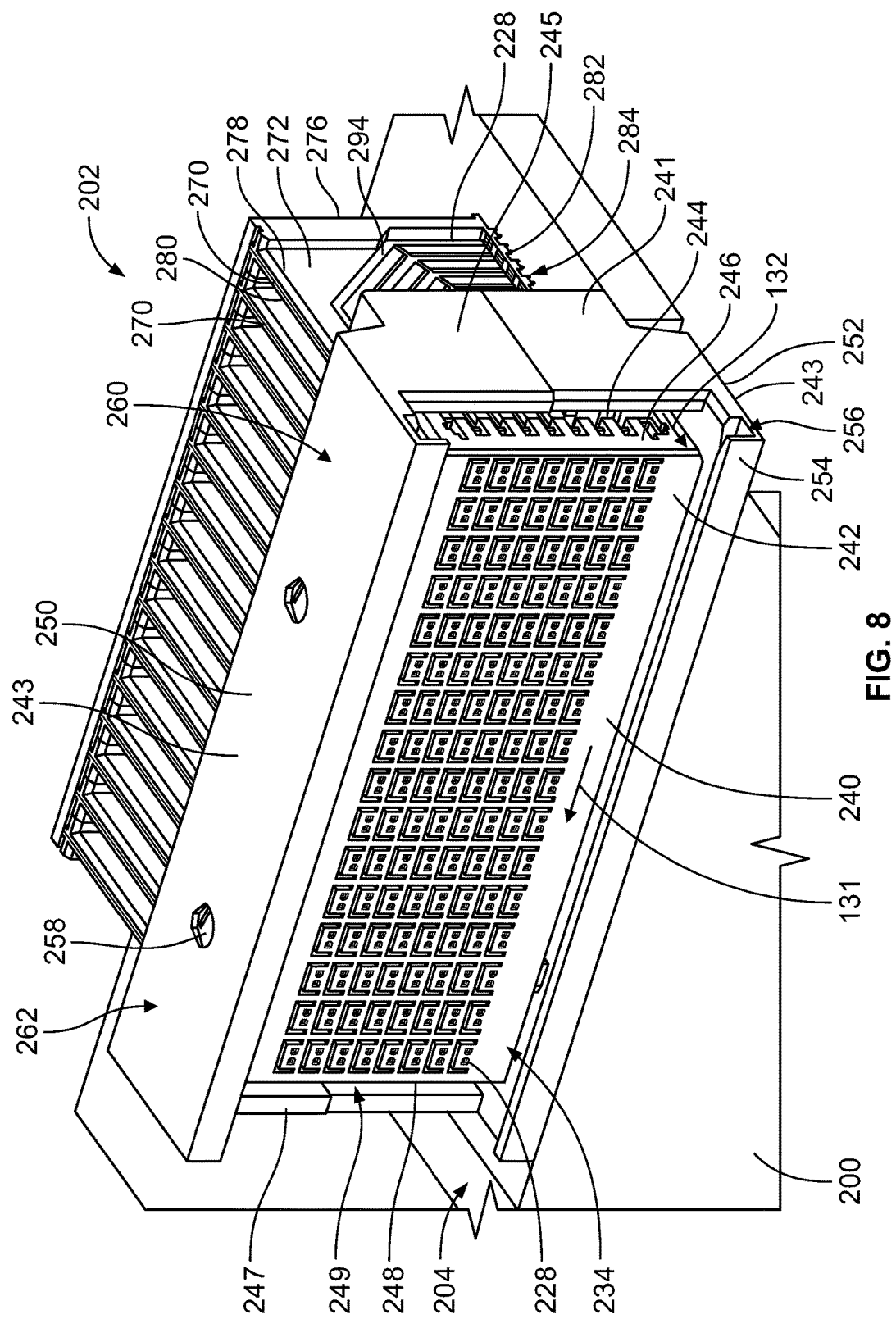
FIG. 8 is a perspective view of a portion of the first circuit card assembly showing the first electrical connector mounted to a first PCB.
Figure 9:
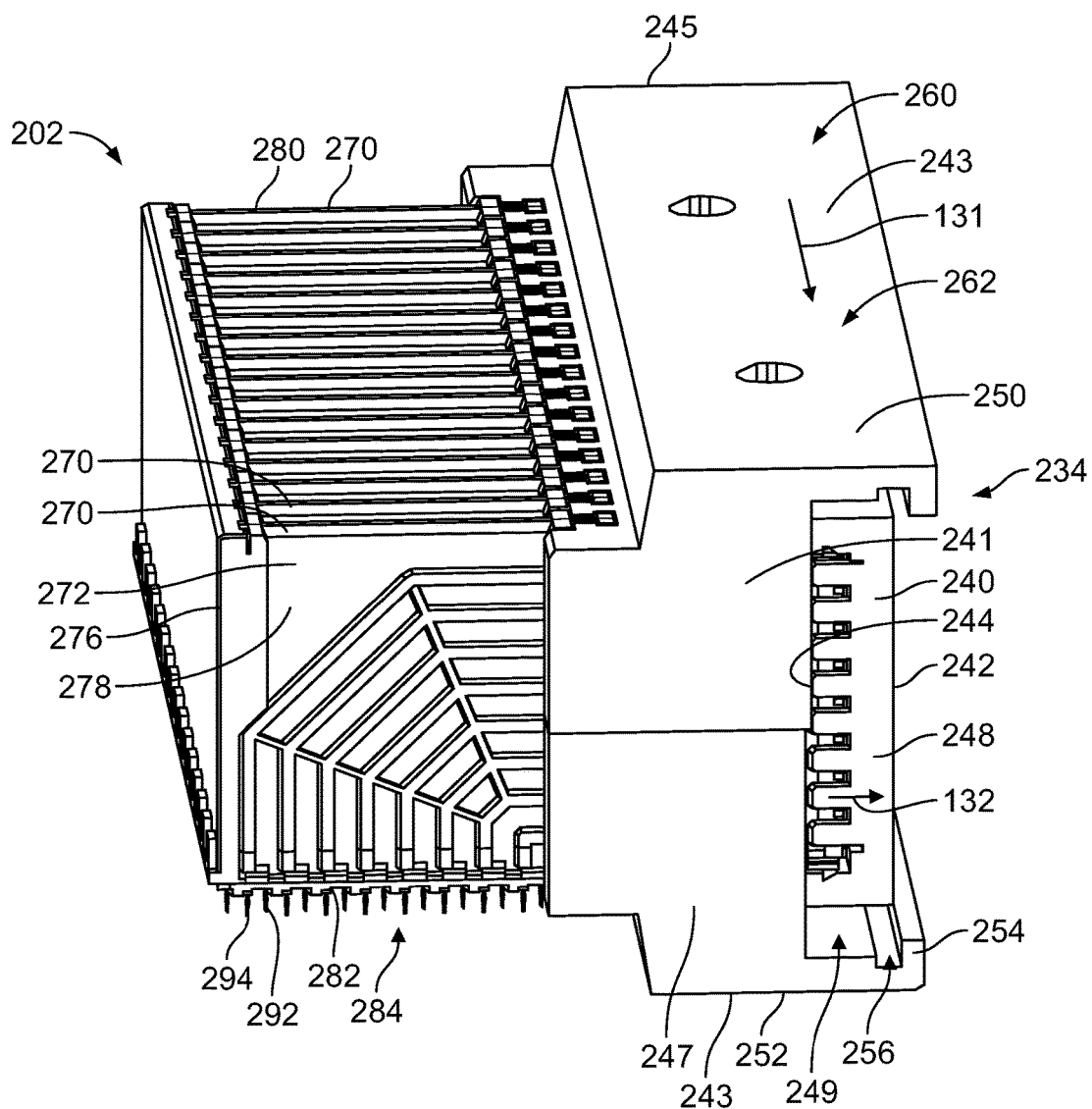
FIG. 9 is a rear perspective view of a first electrical connector of the first circuit card assembly in accordance with an exemplary embodiment.
Figure 10:
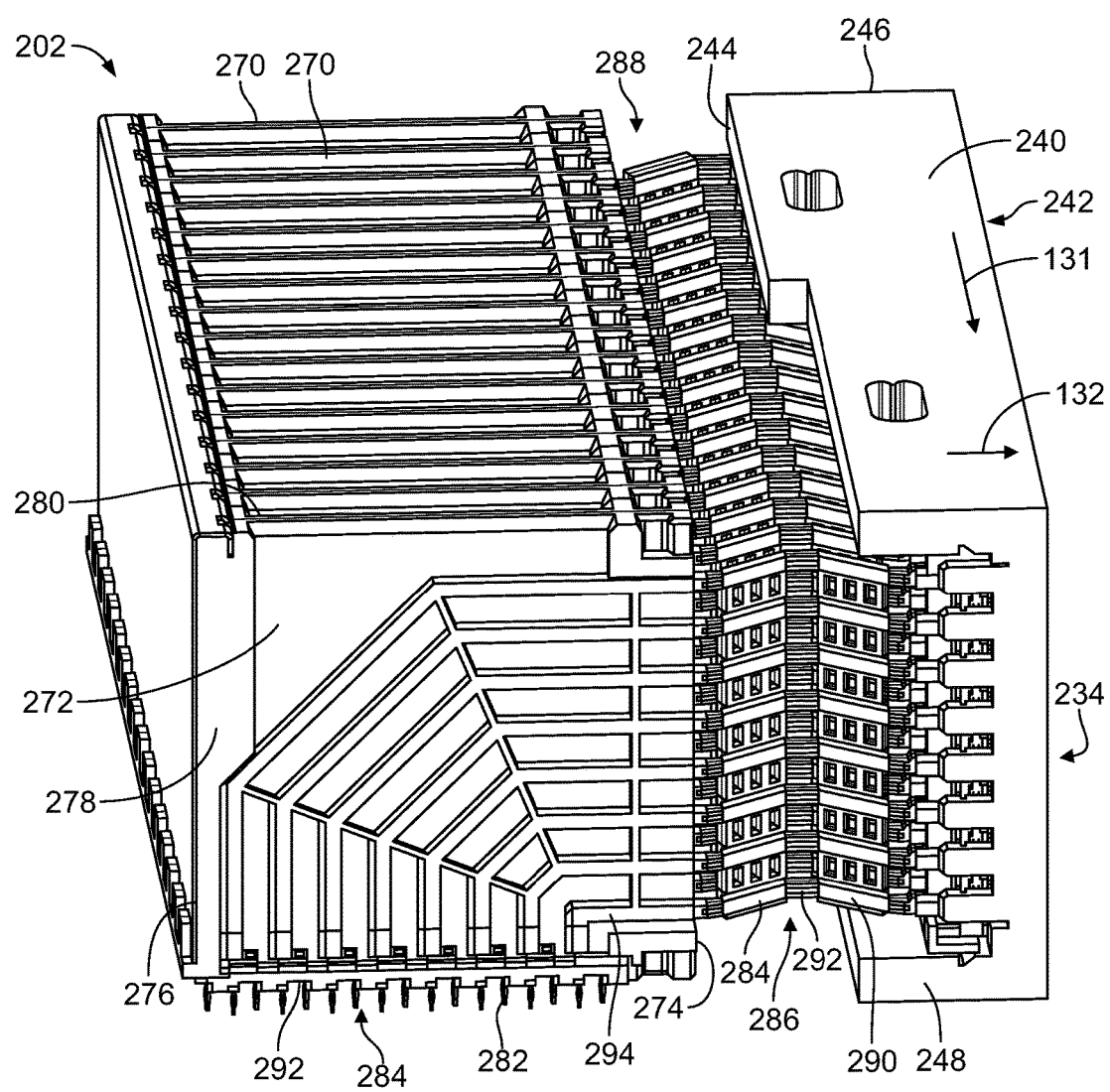
FIG. 10 is a rear perspective view of a portion of the first electrical connector in accordance with an exemplary embodiment.
Figure 11:
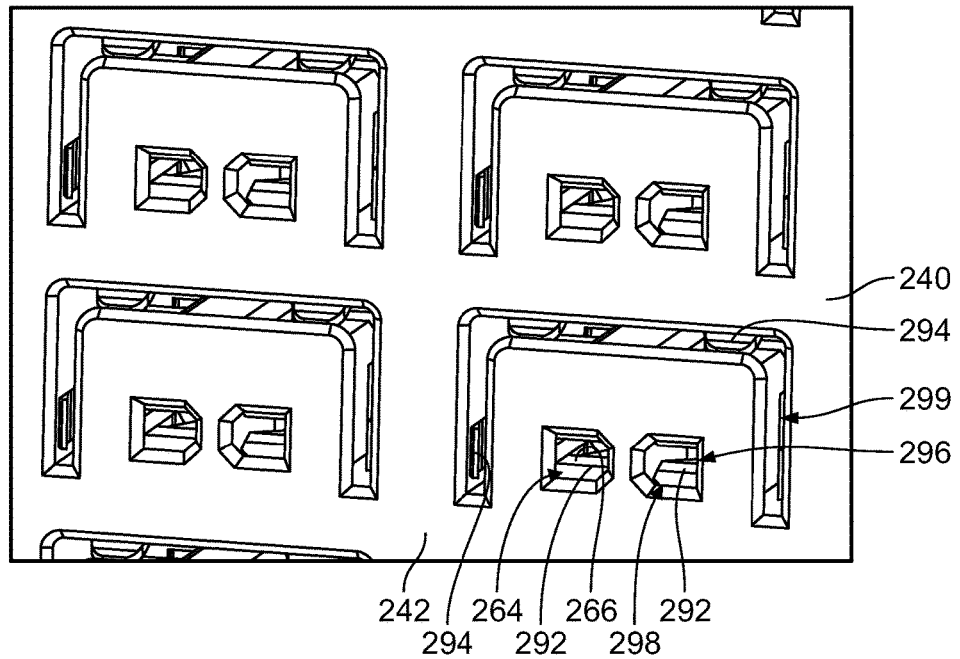
FIG. 11 is an end view of a portion of the first electrical connector in accordance with an exemplary embodiment.

FIG. 8 is a side perspective view of the first electrical connector 202 in accordance with an exemplary embodiment. FIG. 9 is a rear perspective view of the first electrical connector 202 in accordance with an exemplary embodiment. FIG. 10 is a rear perspective view of a portion of the first electrical connector 202 in accordance with an exemplary embodiment. FIG. 11 is a side perspective view of a portion of the first electrical connector 202 in accordance with an exemplary embodiment.

In an exemplary embodiment, the first electrical connector 202 includes a mating housing 240 at the mating end 234 and a receptacle housing 241 (removed in FIG. 10 to illustrate other components) surrounding at least a portion of the mating housing 240. The mating housing 240 is movable within the receptacle housing 241, such as in a connector loading direction 131 and in the connector mating direction 132. Such movement allows mating of the first contacts 228 with the second contacts 328 (see FIG. 13) of the second electrical connector 302 in a perpendicular mating direction to the board loading direction 130. Such movement allows mating of the first contacts 228 with the second contacts 328 in a direction generally parallel to the contacts 228 (for example, a longitudinal axis of the contacts 228).

The mating housing 240 includes a first side 242, a second side 244, a front 246 and a rear 248. The first side 242 defines the mating end 234 of the electrical connector 202. The mating end 234 is oriented perpendicular to the first PCB 200. In an exemplary embodiment, the mating housing 240 holds the contacts 228 for mating with the second electrical connector 302 (shown in FIG. 2). For example, each of the contacts 228 includes a mating end 264 (FIG. 11) at the first side 242 for mating with the second electrical connector 302. For example, the mating ends 264 may be in contact channels defined in the mating housing 240 that are open at the first side 242 to provide access to the contacts 228 for the contacts 328. In other various embodiments, the contacts 228 may extend from the first side 242 a distance for mating with the contacts 328. The mating ends 264 are provided at the first side 242 in a predetermined layout for mating with the second electrical connector 302. The mating ends 264 have mating interfaces 266 (FIG. 11) configured to engage the mating contacts 328 (shown in FIG. 13) when mated thereto. Other types of mating ends may be provided in alternative embodiments, such as spring beams, pins, sockets, and the like.

The receptacle housing 241 includes end walls 243 extending between a front wall 245 and a rear wall 247. The walls 243, 245, 247 define a cavity 249 that receives the mating housing 240. In an exemplary embodiment, the end walls 243 are provided at a top 250 and a bottom 252 of the first electrical connector 202. In an exemplary embodiment, the first electrical connector 202 includes connecting elements 254 at the top 250 and the bottom 252 for connecting the first electrical connector 202 to the second electrical connector 302. In the illustrated embodiment, the connecting elements 254 are defined by grooves 256 in the receptacle housing 241 at the top 250 and the bottom 252 configured to receive portions of the second electrical connector 302. The connecting elements 254 secure the receptacle housing 241 to the second electrical connector 302 as the electrical connectors 202, 302 are coupled together (for example, as the PCBs 200, 300 are moved in the board loading direction). Other types of connecting elements 254 may be provided in alternative embodiments, such as pins, clips, fasteners, and the like.

The electrical connector 202 includes drive members 258 (FIG. 8) at the top 250 and the bottom 252 for actuating the mating housing 240 relative to the receptacle housing 241 during mating. The drive members 258 may be positioned in the cavity 249, such as at the end wall(s) 243 at the top 250 and/or at the bottom 252. The drive members 258 are operably coupled to the receptacle housing 241 and operably coupled to the mating housing 240. As the drive members 258 are operated, the drive members 258 move the mating housing 240 sideways relative to the receptacle housing 241 in the connector mating direction 132. In an exemplary embodiment, the drive members 258 may be actuated by engagement with the second electrical connector 302 as the first and second electrical connectors 302 are coupled together. For example, actuators, such as ramps, may be provided on the second electrical connector 302 to actuate the drive members 258 as the drive members 258 engage the actuators. In an exemplary embodiment, multiple drive members 258 are provided, such as at a front section 260 and a rear section 262 of the electrical connector 202. More than two drive members 258 may be provided along either or both sides of the electrical connector 202. In an exemplary embodiment, the drive members 258 are cam levers and may be referred to hereinafter as cam levers 258. However, other types of drive members 258 may be provided in alternative embodiments, such as cam pins configured to be received in cam sockets, pinions configured to engage a rack, a crank configured to engage a rack, a crank configured to engage an idler gear, one or more linkages configured to engage an actuator, and the like.

In an exemplary embodiment, the electrical connector 202 includes contact modules 270 each holding a plurality of the contacts 228. The contact modules 270 may be coupled to the receptacle housing 241 and/or the mating housing 240, such as at the second side 244. For example, in the illustrated embodiment, the contact modules 270 are loaded into the receptacle housing 241 behind the mating housing 240. In an exemplary embodiment, each contact module 270 includes a dielectric body 272 holding corresponding contacts 228. For example, the dielectric body 272 may be overmolded around portions of the contacts 228. Optionally, the contact modules 270 may include ground shields (not shown) to provide electrical shielding for the contacts 228.

The contact modules 270 each have a first side 274 facing the mating housing 240 and a second side 276 opposite the first side 274. The contact module 270 includes sides 278 facing each other when the contact modules 270 are stacked front to rear within the electrical connector 202. Any number of the contact modules 270 may be stacked together depending on the particular application. The number of contacts 228 within the electrical connector 202 may be increased or decreased by changing the number of contact modules 270 rather than retooling to increase the number of contacts per contact module, as is common in conventional systems, such retooling being expensive. The contact module 270 includes a top 280 and a bottom 282. The bottom 282 is configured to be mounted to the first PCB 200 (FIG. 8). Optionally, portions of the contacts 228 may extend below the bottom 282 for termination to the first PCB 200. For example, each of the contacts 228 may include a terminating end 284 (FIG. 9) configured to be terminated to the first PCB 200. For example, the terminating end 284 may be a compliant pin, such as an eye of the needle pin, configured to be press-fit into plated vias in the first PCB 200. In other various embodiments, the terminating end 284 may be a solder tail or another type of terminating end.

In an exemplary embodiment, the electrical connector 202 includes a compliant section 286 between the contact modules 270 and the mating housing 240 that allows the mating housing 240 to shift relative to the contact modules 270, such as during mating with the second electrical connector 302. For example, the contact modules 270 may not engage the mating housing 240 in various embodiments. Rather, a gap 288 (FIG. 10) may be provided between the first sides 274 of the contact modules 270 and the second side 244 of the mating housing 240. The contacts 228 may span the gap 288 between the contact modules 270 and the mating housing 240. The contacts 228 include flexible sections 290 between the mating ends 264 and the terminating ends 284 to allow relative movement of the contacts 228 and the mating housing 240. The flexible sections 290 may be defined by sections of the contacts 228 that are not encased or enclosed by the dielectric body 272 and/or do not extend through the mating housing 240. For example, the flexible sections 290 may be located in the gap 288. Optionally, the flexible sections 290 may be enclosed or shrouded by a portion of the electrical connector 202, such as a shroud extending from the second side 244 of the mating housing 240 or a separate housing component.

In an exemplary embodiment, the contacts 228 include signal contacts 292 and ground contacts 294 (FIG. 11). Optionally, the signal contacts 292 may be arranged in pairs 296 configured to convey differential signals. The ground contacts 294 are interspersed with the signal contacts 292 to provide electrical shielding for the signal contacts 292. For example, the ground contacts 294 may be provided between the pairs 296 of signal contacts 292. Optionally, the ground contacts 294 may be provided above, below, and/or between the various pairs 296 of signal contacts 292. The signal contacts 292 and/or the ground contacts 294 may be stamped and formed contacts. In an exemplary embodiment, the mating housing 240 includes signal contact channels 298 holding corresponding signal contacts 292 and ground contact channels 299 holding corresponding ground contacts 294. Optionally, the signal contact channels 298 may be arranged in pairs holding pairs of the signal contacts 292. Optionally, the ground contact channels 299 may be C-shaped to receive C-shaped ground shields of the second electrical connector 302; however, the ground contact channels 299 may have other shapes in alternative embodiments. Optionally, multiple ground contacts 294 may be arranged within each ground contact channel 299, such as for interfacing with the C-shaped ground contacts of the second electrical connector 302.

As shown in FIG. 8, the bottoms 282 of the contact modules 270 are mounted to the PCB 200. In an exemplary embodiment, the mating housing 240 is positioned above the first slot 204 for mating with the second electrical connector 302 (shown in FIG. 2). In an exemplary embodiment, the mating housing 240 is movable relative to the PCB 200 and the contact modules 270, which are fixed to the PCB 200. For example, the flexible sections 290 of the contacts 228 defining the compliant section 286 of the electrical connector 202 allow the mating housing 240 to move relative to the PCB 200 during mating with the second electrical connector 302.

Figure 12:
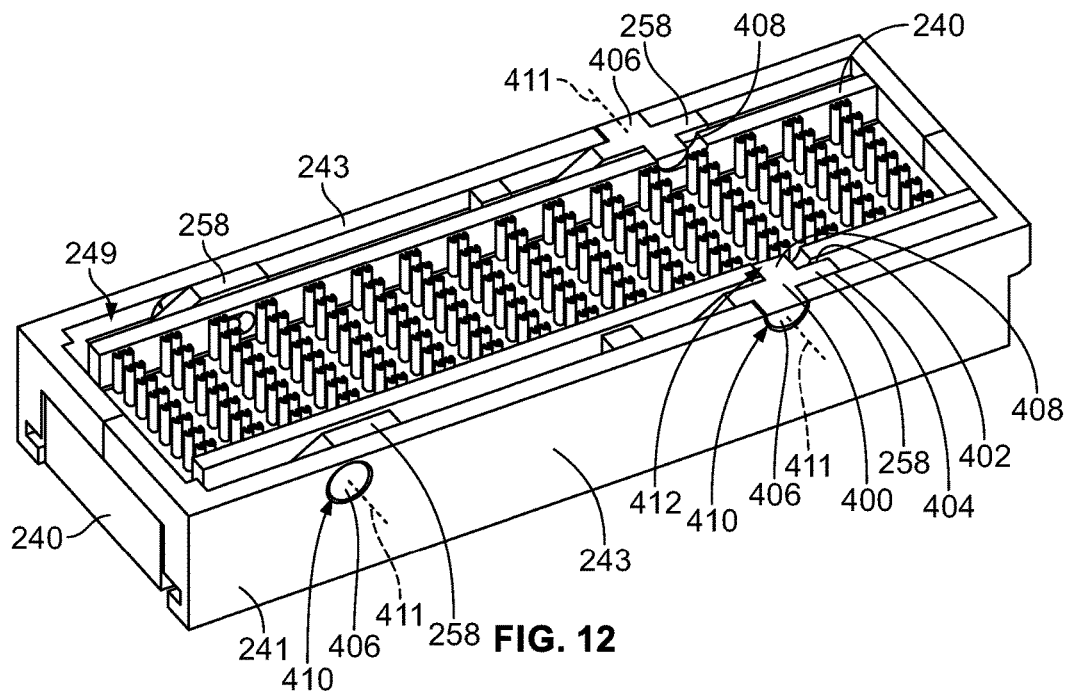
FIG. 12 is a partial sectional view of a portion of the first electrical connector in accordance with an exemplary embodiment.

FIG. 12 is a rear perspective, partial sectional view of a portion of the first electrical connector 202. FIG. 12 shows the mating housing 240 positioned in the cavity 249. Optionally, the receptacle housing 241 may be oversized relative to the mating housing 240 (such as elongated front-to-rear) to allow axial movement (for example, front-to-rear) of the mating housing 240 in the cavity 249. For example, the mating housing 240 is able to move in the connector loading direction when mating with the second electrical connector 302.

The drive members 258 are positioned between the mating housing 240 and the receptacle housing 241. In the illustrated embodiment, the drive members 258 are cam levers 258 each having a body 400 extending between a first side 402 and a second side 404. The cam levers 258 includes a fixed pivot 406 extending from the second side 404 and a movable pusher 408 extending from the first side 402. The fixed pivot 406 is received in an opening 410 in the corresponding end wall 243 of the receptacle housing 241 and is configured to rotate about a pivot axis 411. The movable pusher 408 is received in an elongated slot 412 in the mating housing 240. The movable pusher 408 is axially movable in the elongated slot 412. For example, as the mating housing 240 is moved in the cavity 249 in the connector mating direction, the position of the movable pusher 408 in the slot 412 changes. The cam levers 258 are pivotable about the fixed pivot 406 to cause the movable pusher 408 to move relative to the receptacle housing 241. As the movable pusher 408 moves relative to the receptacle housing 241, the mating housing 240 moves relative to the receptacle housing 241 in the connector mating direction 132.

Figure 13:
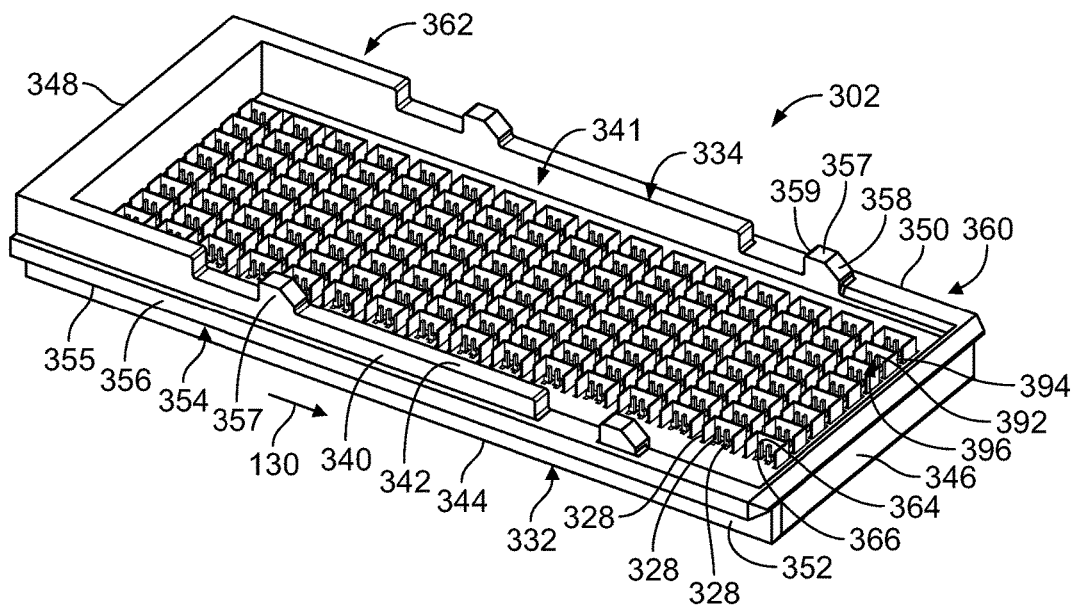
FIG. 13 is a perspective view of a second electrical connector in accordance with an exemplary embodiment.
Figure 14:
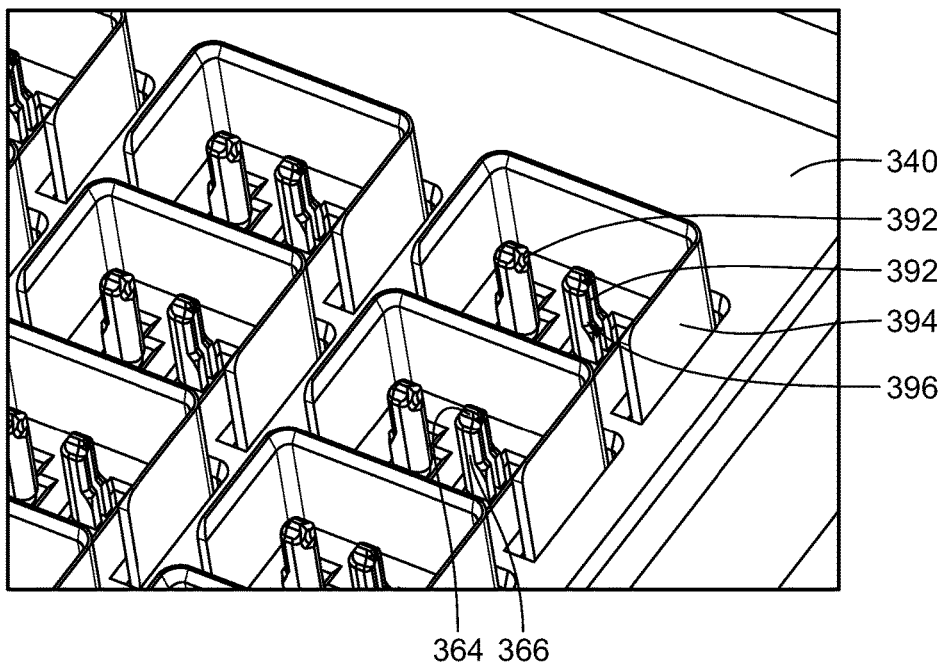
FIG. 14 is a perspective view of a portion of the second electrical connector in accordance with an exemplary embodiment.

FIG. 13 is a perspective view of the second electrical connector 302 of the second circuit card assembly 122 in accordance with an exemplary embodiment. FIG. 14 is a perspective view of a portion of the second electrical connector 302 in accordance with an exemplary embodiment. In an exemplary embodiment, the electrical connector 302 includes a header housing 340 holding the contacts 328. The header housing 340 includes walls defining a cavity 341 configured to receive the mating housing 240 of the first electrical connector 202 (both shown in FIG. 8).

The header housing 340 includes a first side 342, a second side 344, a front 346 and a rear 348. The first side 342 defines the mating end 334 of the electrical connector 302. The mating end 334 is oriented parallel to the second PCB 300. In an exemplary embodiment, the header housing 340 holds the contacts 328 for mating with the first electrical connector 202. For example, each of the contacts 328 includes a mating end 364 exposed at or beyond the first side 342 for mating with the first electrical connector 202. The mating ends 364 are provided at the first side 342 in a predetermined layout for mating with the first electrical connector 202. The mating ends 364 have mating interfaces 366 for electrical connection with the first contacts 228.

The header housing 340 includes a top 350 and a bottom 352. In an exemplary embodiment, the top 350 and the bottom 352 include connecting elements 354 for connecting the second electrical connector 302 to the first electrical connector 202. In the illustrated embodiment, the connecting elements 354 include flanges 356 defined by ledges 355 that face the second side 344. The flanges 356 are configured to interface with corresponding connecting elements 254 (shown in FIG. 8) of the receptacle housing 241 of the first electrical connector 202. The flanges 356 are configured to be received in corresponding grooves 256 (shown in FIG. 8). Other types of connecting elements 354 may be provided in alternative embodiments, such as pins, clips, fasteners, and the like.

The header housing 340 includes actuators 357 at the first side 342 configured to actuate the drive members 258 (shown in FIG. 12). In the illustrated embodiment, the actuators 357 include ramp surfaces 358 and return surfaces 359 that engage the drive members 258 and actuate the drive members 258 as the drive members 258 ride along the header housing 340 during mating of the first and second electrical connectors 202, 302 in the board loading direction 130. In the illustrated embodiment, the header housing 340 includes multiple actuators 357 laterally spaced apart, such as for actuating multiple drive members 258. For example, the header housing 340 may include actuators 357 along both the top 350 and the bottom 352 at both a front section 360 and a rear section 362 of the header housing 340. Optionally, the actuators 357 may be at different heights, such as shorter at the front section 360 and taller at the rear section 362 to allow actuation of different drive members 258. Optionally, the actuators 357 may be staggered within the cavity 341 such as closer in or further out to align with corresponding staggered drive members 258.

The header housing 340 defines the mounting end 332 of the electrical connector 302 configured to be mounted to the PCB 300. Optionally, portions of the contacts 328 may extend beyond the mounting end 332 for termination to the PCB 300. For example, the contacts 328 may include terminating ends (not shown), such as compliant pins, solder tails, and the like, configured to be terminated to the PCB 300.

In an exemplary embodiment, such as shown in FIG. 14, the contacts 328 include signal contacts 392 and ground contacts 394. Optionally, the signal contacts 392 may be arranged in pairs 396 configured to convey differential signals (differential pairs of signal contacts); however, the signal contacts 392 may convey single-ended signals rather than differential signals. The ground contacts 394 are interspersed with the signal contacts 392 to provide electrical shielding for the signal contacts 392. For example, the ground contacts 394 may be provided between the pairs 396 of signal contacts 392. In the illustrated embodiment, the signal contacts 392 are pin contacts; however, other types of contacts may be used in alternative embodiments, such as sockets, spring beams, and the like. In the illustrated embodiment, the ground contacts 394 are C-shaped shields having walls on three sides of each corresponding pair of signal contacts 392. However, the ground contacts 394 may have other shapes in alternative embodiments.

Figure 15:
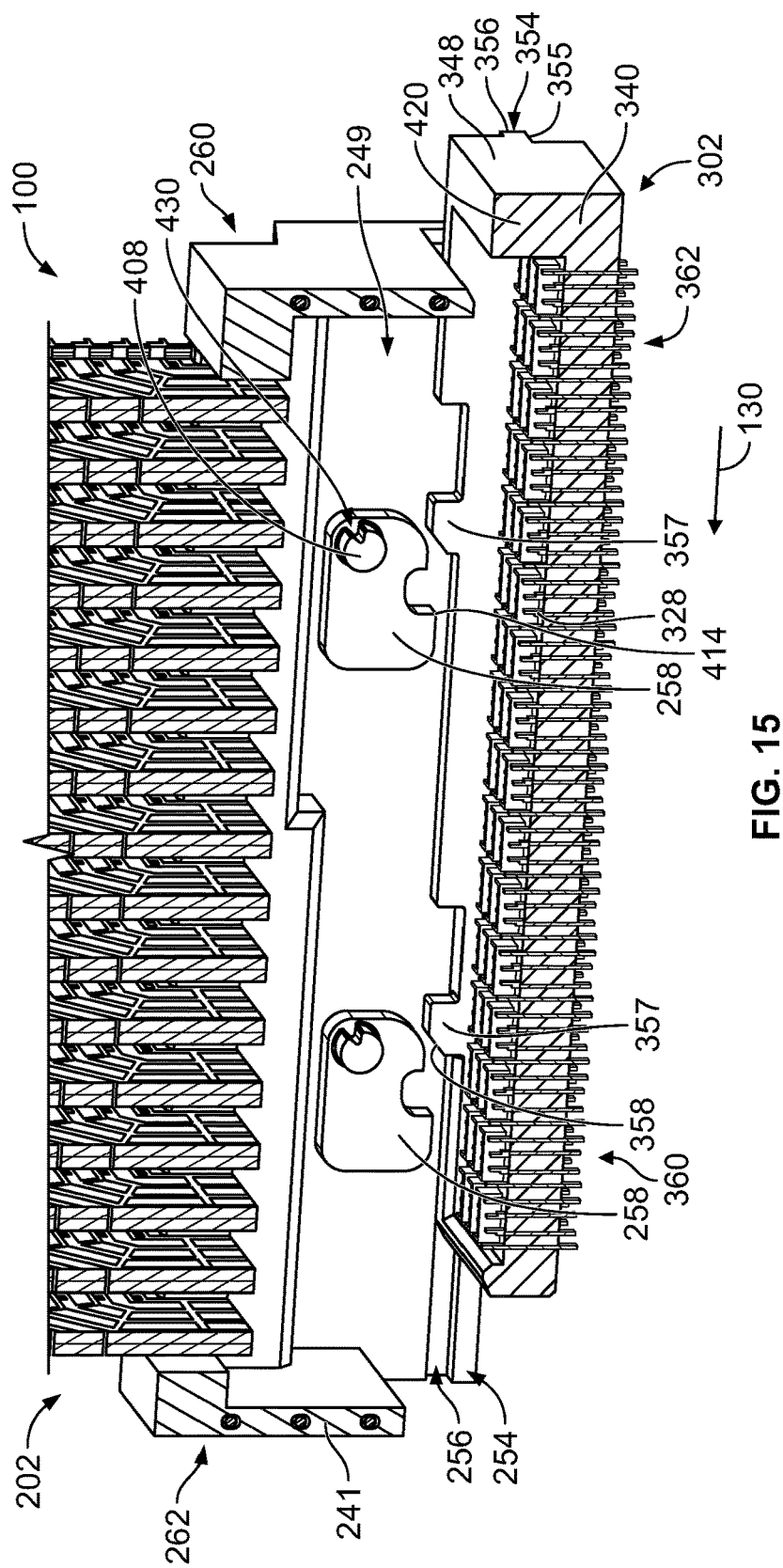
FIG. 15 illustrates a portion of the communication system showing a portion of the first electrical connector partially mated with the second electrical connector.
Figure 16:
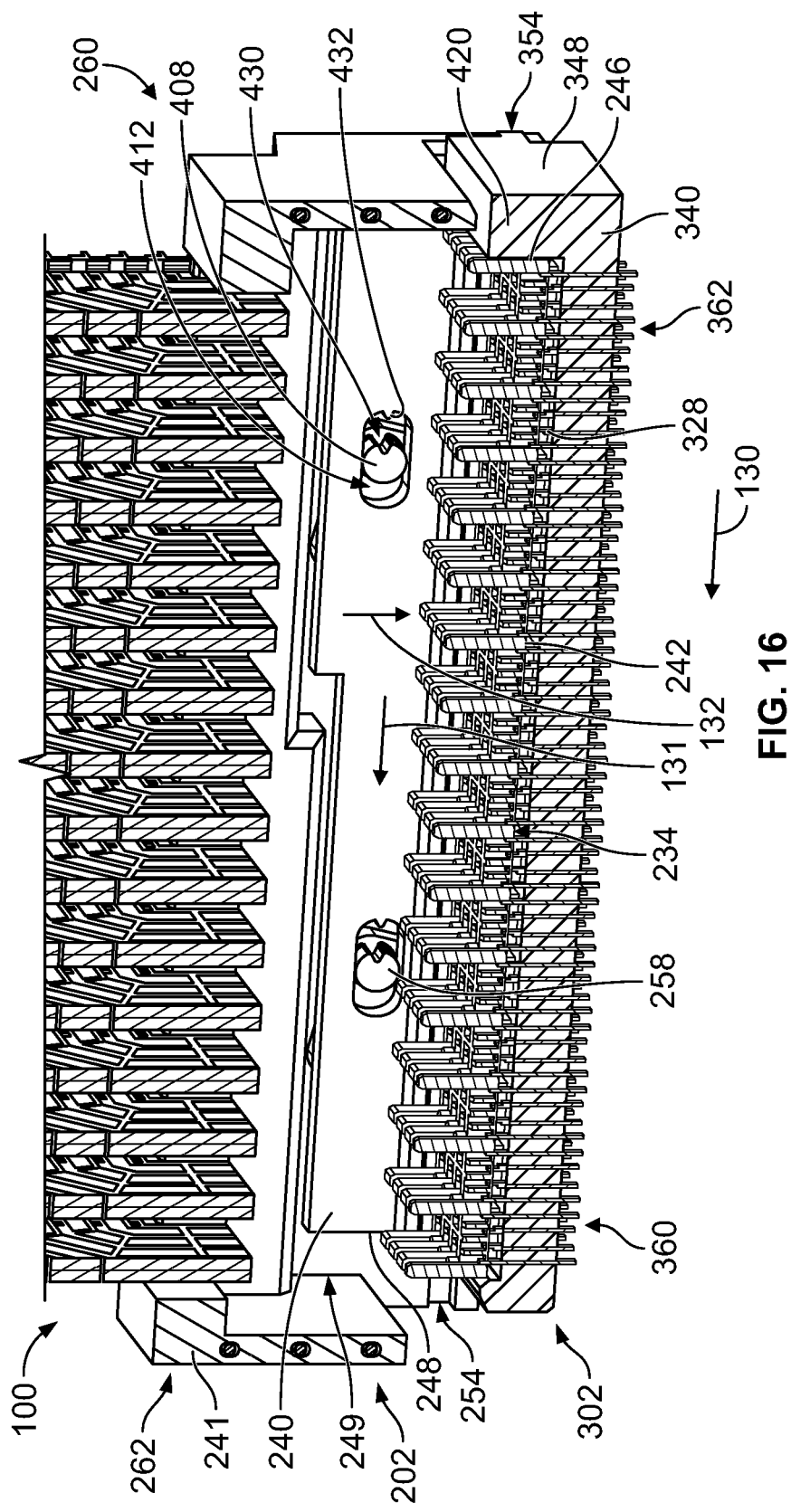
FIG. 16 illustrates a portion of the communication system showing a portion of the first electrical connector partially mated with the second electrical connector.

FIG. 15 illustrates a portion of the communication system 100 showing a portion of the first electrical connector 202 partially mated with the second electrical connector 302. FIG. 16 illustrates a portion of the communication system 100 showing a portion of the first electrical connector 202 partially mated with the second electrical connector 302. FIG. 15 shows the header housing 340 partially loaded into the receptacle housing 241 (the mating housing 240 is removed to illustrate various components of the first electrical connector 202), such as the cam levers 258 of the first electrical connector 202 relative to the header housing 340 of the second electrical connector 302. FIG. 16 shows the first electrical connector 202 with the mating housing 240 in the receptacle housing 241.

During mating, the second electrical connector 302 is slid forward in the board loading direction 130 with the second PCB 300 into the slot 204 (shown in FIG. 8) in the first PCB 200 (shown in FIG. 8). The connecting elements 254 of the first electrical connector 202 engage the connecting elements 354 of the second electrical connector 302. For example, the flange 356 is received in the groove 256. A portion of the receptacle housing 241 is captured below the ledge 355.

As such, the receptacle housing 241 is fixedly coupled to the header housing 340. As the header housing 340 is slid forward in the board loading direction 130, the actuators 357 are configured to interact with the cam levers 258. In an exemplary embodiment, the actuators 357 are at different heights. For example, the actuator 357 at the front section 360 is shorter and the actuator 357 at the rear section 362 is taller. Optionally, the cam levers 258 may be staggered. For example, the cam lever 258 at the front section 260 is positioned further from the first side 242 and the cam lever 258 at the rear section 262 is positioned closer to the first side 242. As such, the actuator 357 at the front section 360 does not interact with or actuate the cam lever 258 at the rear section 262 as the header housing 340 passes through the receptacle housing 241.

During loading, the second electrical connector 302 slides into the first electrical connector 202 (or the first electrical connector 202 into the second electrical connector 302) in the board loading direction 130, the header housing 240 is moved past the mating end 234 of the first electrical connector 202 to align the contacts 328 with the corresponding contacts 228. The header housing 340 is loaded into the cavity 249 in the board loading direction 130 to an initial loaded position (FIG. 16) and then is configured to be further moved in the board loading direction 130 to a final loaded position.

In the initial loaded position, the header hosing 340 is aligned with the mating housing 240. In the initial loaded position, the contacts 328 are aligned with the corresponding contacts 228. In the initial loaded position, the header housing 340 engages the mating housing 240 such that further movement of the header housing 340 in the board loading direction 130 corresponds with movement of the mating housing 240 in the connector loading direction 131. For example, in an exemplary embodiment, the header housing 340 includes a stop wall 420 at the rear 348 (or the mating housing 240 includes the stop wall 420 at the front 246). The stop wall 420 engages the front 246 of the mating housing 240 to stop relative movement between the header housing 340 and the mating housing 240. However, in alternative embodiments, the stop wall 420 may be at the front 346, or elsewhere, configured to engage the rear 248, or elsewhere, on the mating housing 240. When the stop wall 420 is engaged, further movement of the header housing 340 translates to movement of the mating housing 240 relative to the receptacle housing 241. Optionally, the cam levers 258 do not engage the actuators 357, or just start to engage the actuators 357, in the initial loaded position. As such, the cam levers 258 have not started to rotate in the initial loaded position. However, further loading of the header housing 340, and thus the mating housing 240, in the board loading direction 130 causes actuation of the cam levers 258. The elongated slots 412 (FIG. 16) allow axial travel of the mating housing 240 relative to the cam levers 258. Additionally, rotation of the cam levers 258 causes sideways movement of the mating housing 240 (for example, toward the header housing 340) in the connector mating direction 132.

The cam levers 258 are positioned in the cavity 249 to engage corresponding actuators 357 when the first electrical connector 202 is coupled to the second electrical connector 302. For example, as the second electrical connector 302 slides into the first electrical connector 202 in the board loading direction 130, the cam levers 258 slide along the ramp surfaces 358 of the actuators 357 causing the cam levers 258 to rotate. In an exemplary embodiment, the cam levers 258 include cam surfaces 414 configured to engage the actuators 357. The cam surfaces 414 are configured to ride along the ramp surfaces 358 as the header housing 340 is slid forward in the board loading direction 130. The cam surfaces 414 may be defined by tips or points of the cam levers 258 in various embodiments or may be defined by flat surfaces or curved surfaces of the cam levers 258 in other various embodiments. Rotation of the cam levers 258 causes movement of the mating housing 240 in the connector mating direction 132 to electrically connect the first contacts 228 and the second contacts 328. For example, the movable pushers 408 are configured to be rotated downward as the cam levers 258 are pivoted.

In an exemplary embodiment, the movable pusher 408 includes a locking feature 430 configured to engage the mating housing 240 to lock the cam lever 258 relative to the mating housing 240, such as to resist rotation of the cam lever 258 relative to the mating housing 240 when engaged thereto (for example, to resist unmating of the mating housing 240 with the header housing 340). The mating housing 240 includes a complementary locking feature 432 configured to interface with the locking feature 430. In the illustrated embodiment, the locking feature 430 is a groove and the locking feature 432 is a protrusion extending into the slot 412. The mating housing 240 is slid in the connector loading direction 131 until the locking feature 432 engages the locking feature 430.

Figure 17:
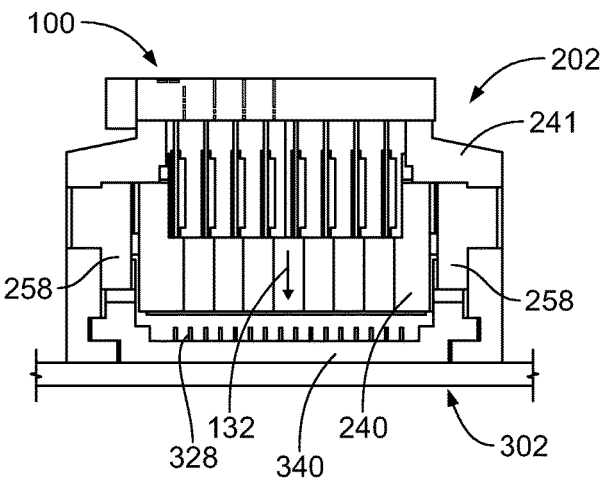
FIG. 17 is a cross-sectional view of a portion of the communication system showing a portion of the first electrical connector partially mated with the second electrical connector.
Figure 18:
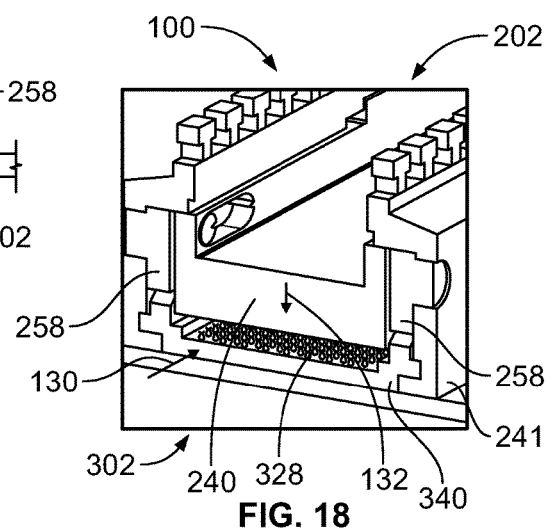
FIG. 18 is a perspective, partial sectional view of a portion of the communication system showing a portion of the first electrical connector partially mated with the second electrical connector.
Figure 19:
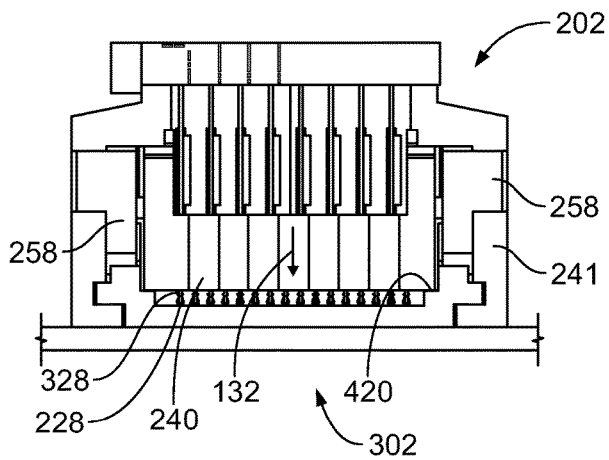
FIG. 19 is a cross-sectional view of a portion of the communication system showing a portion of the first electrical connector mated with the second electrical connector.

FIG. 17 is a cross-sectional view of a portion of the communication system 100 showing a portion of the first electrical connector 202 partially mated with the second electrical connector 302. FIG. 18 is a perspective, partial sectional view of a portion of the communication system 100 showing a portion of the first electrical connector 202 partially mated with the second electrical connector 302. FIGS. 18 and 19 illustrate the first electrical connector 202 positioned prior to actuation of the cam levers 258, such as at the initial loaded position. The mating housing 240 is elevated and separated from the header housing 340. The cam levers 258 hold the mating housing 240 in a clearance position to allow the header housing 340 and the second contacts 328 to be loaded into the first electrical connector 202 in the board loading direction 130.

Figure 20:
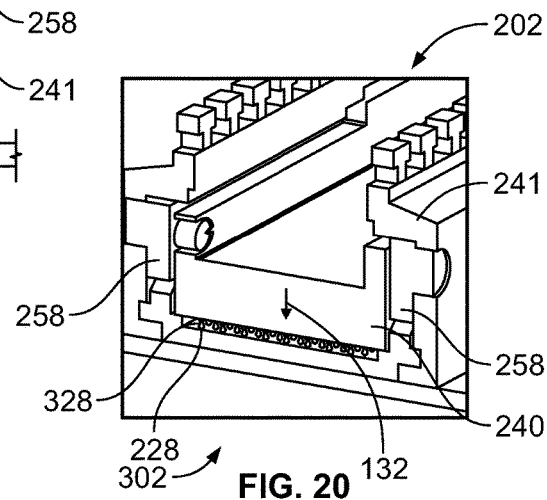
FIG. 20 is a perspective, partial sectional view of a portion of the communication system showing a portion of the first electrical connector mated with the second electrical connector.
Figure 21:
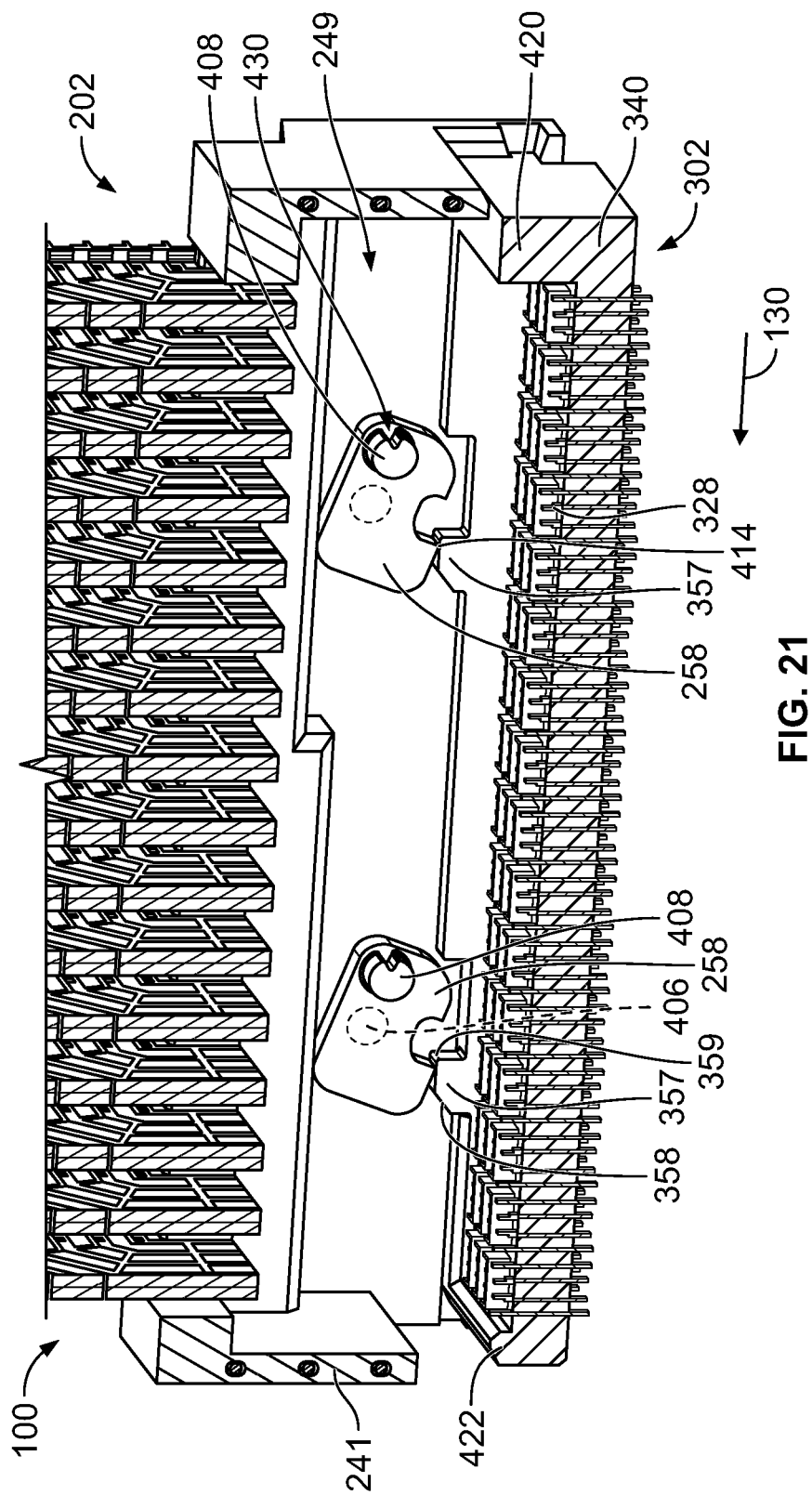
FIG. 21 illustrates a portion of the communication system showing a portion of the first electrical connector mated with the second electrical connector.
Figure 22:
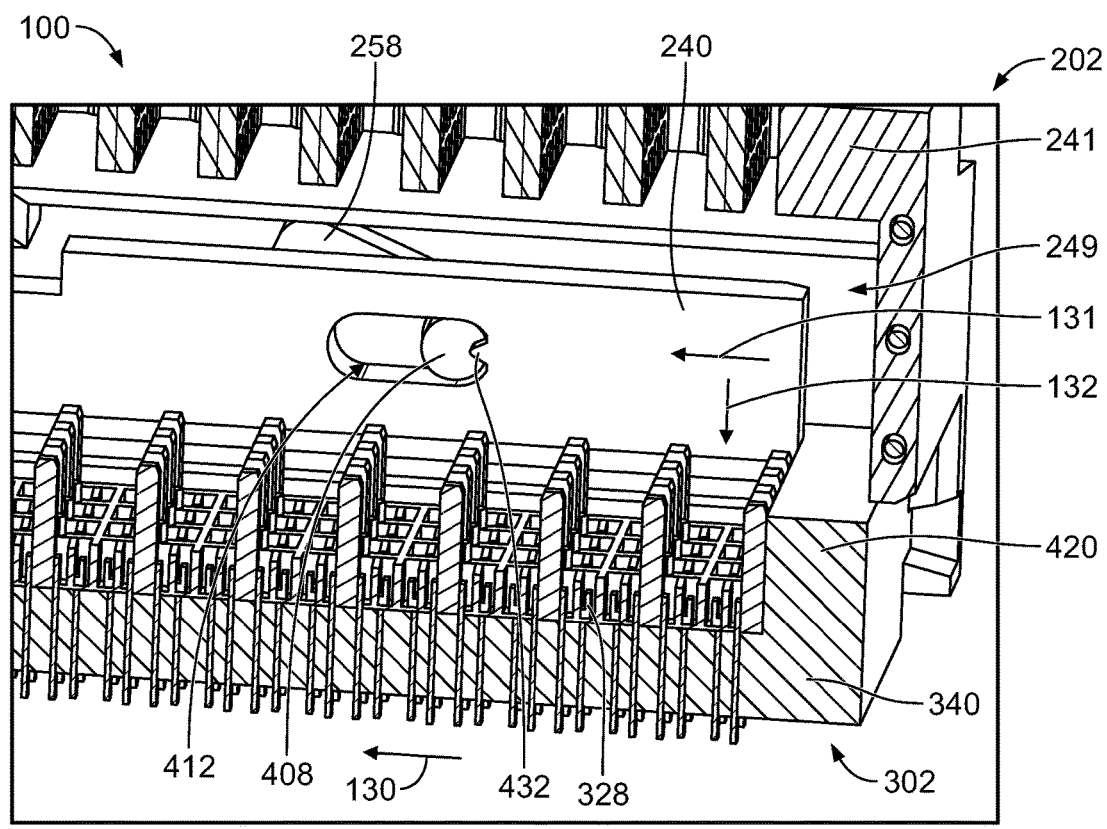
FIG. 22 illustrates a portion of the communication system showing a portion of the first electrical connector mated with the second electrical connector.

FIG. 19 is a cross-sectional view of a portion of the communication system 100 showing a portion of the first electrical connector 202 mated with the second electrical connector 302. FIG. 20 is a perspective, partial sectional view of a portion of the communication system 100 showing a portion of the first electrical connector 202 mated with the second electrical connector 302. FIG. 21 illustrates a portion of the communication system 100 showing a portion of the first electrical connector 202 fully mated with the second electrical connector 302 (the mating housing 240 is removed to illustrate various components of the first electrical connector 202). FIG. 22 illustrates a portion of the communication system 100 showing a portion of the first electrical connector 202 fully mated with the second electrical connector 302. FIGS. 19-22 illustrate the first and second electrical connectors 202, 302 after actuation of the cam levers 258.

The cam levers 258 are actuated as the header housing 340, and thus the mating housing 240 are moved in the cavity 249 in the connector loading direction 131 relative to the receptacle housing 241. The mating housing 240, because of the engagement with the stop wall 420, is slid axially in the connector loading direction 131. As such, the contacts 228 are moved axially with the contacts 328 (for example, the relative axial positions between the contacts 228 and the contacts 328 do not change) as both housings 240, 340 are moved in the connector loading direction. The elongated slot 412 allows the relative axial sliding movement of the mating housing 240 relative to the receptacle housing 241.

The actuators 357 (FIG. 21) are illustrated engaged with the cam levers 258. During mating, the cam surfaces 414 ride along the ramp surfaces 358 of the actuators 357 to rotate the cam levers 258. As the cam levers 258 rotate, the movable pushers 408 are pivoted and moved toward the header housing 340 in the connector mating direction 132. During mating, the mating housing 240 is driven toward the header housing 340 in the connector mating direction 132 to mate the first contacts 228 and the second contacts 328. In an exemplary embodiment, the header housing 340 includes stop surfaces that stop mating of the mating housing 240 with the header housing 340.

The header housing 340 is driven in the board loading direction 130 until fully mated. Once the cam surfaces 414 clear the ramp surfaces 358, the cam levers 258 are no longer rotated. Further travel of the header housing 340 causes the cam surfaces 414 to ride along the flat edge of the actuator 357 without further rotation of the cam levers 258. When fully rotated, the locking feature 430 of the cam lever 258 is in proper rotational orientation with respect to the locking feature 432 of the mating housing 240. As the mating housing 240 slides axially forward, the locking features 430, 432 will nest and lock to prevent further rotation in either direction of the cam lever 258.

Over travel of the header housing 340 in the board loading direction 130 causes the mating housing 240 to move forward with the header housing 340. For example, the electrical connectors 202, 302 may be designed to accommodate a predetermined amount of overtravel, such as a tolerance for mating of the circuit card assemblies 120, 122. In an exemplary embodiment, the cam levers 258 are designed to accommodate the over travel. For example, the fixed pivots 406 may include compression features to allow compression travel to accommodate the overtravel amount.

During unmating of the first and second electrical connectors 202, 302, a return cam surface 416 of the cam lever 258 engages the return surface 359 of the actuator 357 to rotate the cam lever 258 in the opposite direction causing the mating housing 240 to move away from the header housing 340. The header housing 340 may then be pulled out of the first electrical connector 202 in an unloading direction during the unmating process. Optionally, the header housing 340 may include a front stop wall 422 that engages the mating housing 240 and pulls the mating housing in the unloading direction.

Figure 23:
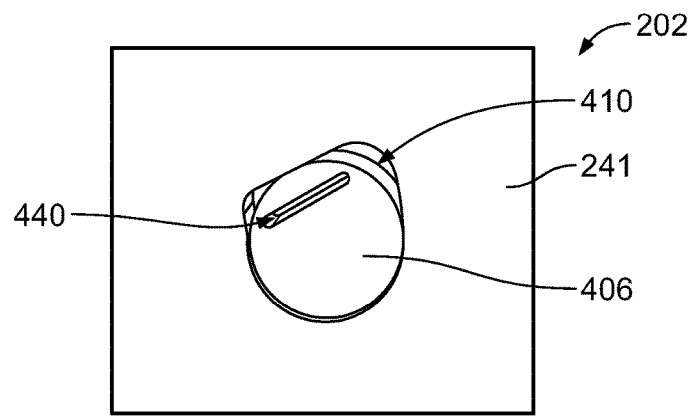
FIG. 23 illustrates a portion of the first electrical connector.

FIG. 23 illustrates a portion of the first electrical connector 202 showing the fixed pivot 406 in the opening 410 in the receptacle housing 241. The fixed pivot 406 includes a compression feature 440 that allows compression of the fixed pivot 406, such as to accommodate overtravel. In the illustrated embodiment, the compression feature 440 is a slot in the fixed pivot 406 that allows part of the fixed pivot 406 to compress. In alternative embodiments, the compression feature 440 may be provided in the receptacle housing 241 rather than the fixed pivot 406.

Figure 24:
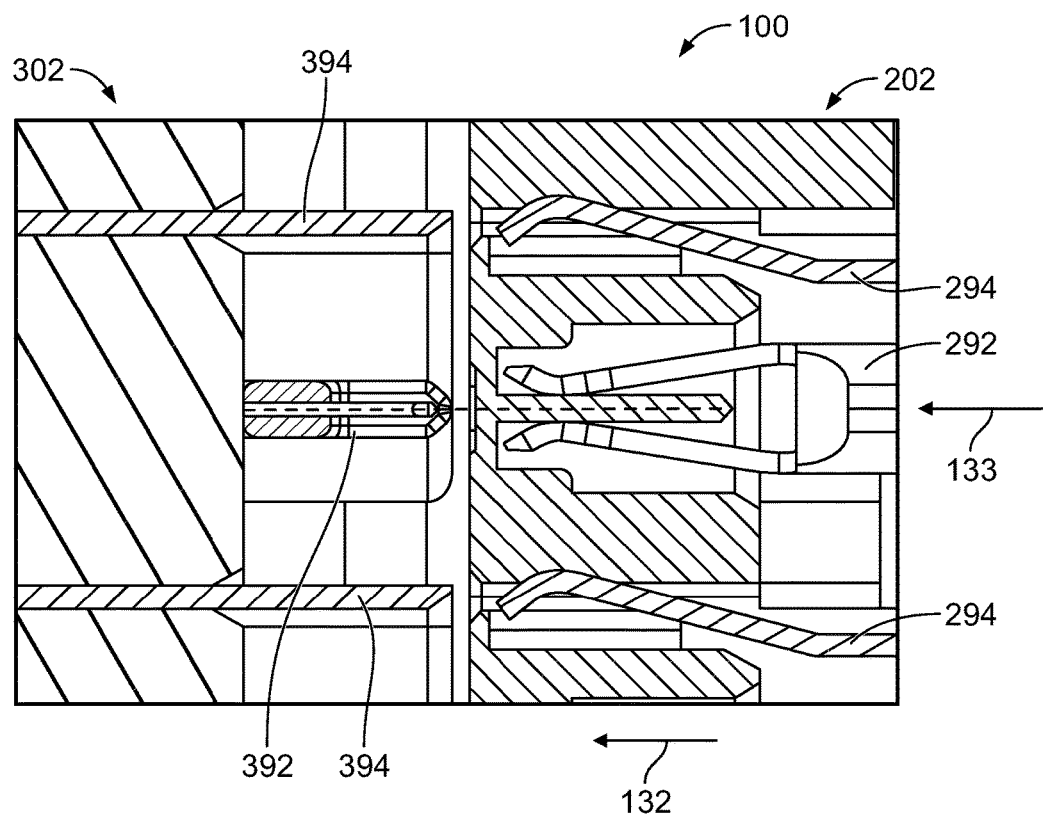
FIG. 24 is a partial sectional view of a portion of the communication system showing a portion of the first electrical connector poised for mating with the second electrical connector.

FIG. 24 is a partial sectional view of a portion of the communication system 100 showing a portion of the first electrical connector 202 poised for mating with the second electrical connector 302. FIG. 24 illustrates the signal contact 292 of the first electrical connector 202 poised for mating with the signal contact 392 of the second electrical connector 302. The signal contacts 292, 392 are configured to be mated in a contact mating direction 133 that is parallel to the connector mating direction 132. The contact mating direction 133 is parallel to the contact axes of the signal contacts 292, 392. The contact mating direction 133 is perpendicular to the board loading direction 130 (shown in FIG. 2). FIG. 24 illustrates the ground contacts 294 of the first electrical connector 202 poised for mating with the ground contact 394 of the second electrical connector 302.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A circuit card assembly for a communication system comprising:
   a printed circuit board (PCB) having a first surface and a second surface and a mating edge between the first and second surfaces, the PCB having a slot extending inward from the mating edge configured to receive a second PCB of a second circuit card assembly in a board loading direction perpendicular to the mating edge, the PCB having a mounting area on the first surface adjacent the slot; and
   an electrical connector mounted to the first surface at the mounting area configured for mating with a second electrical connector of the second circuit card assembly, the electrical connector having a receptacle housing fixed relative to the PCB and having a cavity, the electrical connector having a mating housing received in the cavity of the receptacle housing, the mating housing being movable relative to the receptacle housing, the electrical connector having contacts held by the mating housing and being movable relative to the receptacle housing with the mating housing, the contacts having mating interfaces configured for mating with contacts of the second electrical connector;
   wherein the receptacle housing is configured to be coupled to the second electrical connector as the second PCB is loaded in the board loading direction;
   wherein the mating housing is movable within the receptacle housing in a connector loading direction along a connector loading axis parallel to the board loading direction and the mating housing being movable in the receptacle housing in a connector mating direction along a connector mating axis perpendicular to the connector loading axis; and
   wherein the contacts of the electrical connector are mated with the contacts of the second electrical connector in a contact mating direction parallel to the connector mating axis.

2. The circuit card assembly of claim 1, wherein the mating housing moves in the board loading direction with the receptacle housing and is configured to move independent of the receptacle housing in the connector mating direction.

3. The circuit card assembly of claim 1, wherein the mating housing includes a stop wall configured to engage the second electrical connector to force the mating housing to move in the connector mating direction relative to the receptacle housing.

4. The circuit card assembly of claim 1, wherein the mating housing engages the second electrical connector and moves in the connector loading direction with the second electrical connector in the cavity to confine mating movement of the first contacts relative to the second contacts in the contact mating direction perpendicular to the board loading direction.

5. The circuit card assembly of claim 1, wherein the electrical connector includes a cam lever pivotably coupled to the receptacle housing and pivotably coupled to the mating housing, the cam lever configured to engage the second electrical connector to move the cam lever and force the mating housing to move relative to the receptacle housing in the connector mating direction.

6. The circuit card assembly of claim 1, wherein the electrical connector includes a cam lever, the cam lever having a fixed pivot received in an opening in the receptacle housing and being pivotably coupled to the receptacle housing at a pivot axis, the cam lever having a movable pusher movable relative to the pivot axis, the movable pusher being received in a slot in the mating housing, the mating housing being driven in the connector mating direction by the movable pusher, the slot allowing the mating housing to slide parallel to the connector loading axis relative to the movable pusher as the mating housing is moved in the connector loading direction.

7. A circuit card assembly for a communication system comprising:
   a printed circuit board (PCB) having a first surface and a second surface and a mating edge between the first and second surfaces, the PCB having a slot extending inward from the mating edge configured to receive a second PCB of a second circuit card assembly in a board loading direction perpendicular to the mating edge, the PCB having a mounting area on the first surface adjacent the slot; and
   an electrical connector mounted to the first surface at the mounting area configured for mating with a second electrical connector of the second circuit card assembly, the electrical connector having a receptacle housing fixed relative to the PCB and having a cavity, the electrical connector having a mating housing received in the cavity of the receptacle housing and being movable relative to the receptacle housing within the cavity, the electrical connector having contacts held by the mating housing and being movable relative to the receptacle housing with the mating housing, the contacts having mating interfaces configured for mating with contacts of the second electrical connector, the electrical connector having a cam lever pivotably coupled between the receptacle housing and the mating housing, the cam lever being pivotably coupled to the receptacle housing about a pivot axis and the cam lever being axially fixed relative to the receptacle housing, the cam lever having a movable pusher being received in an elongated slot in the mating housing and engaging the mating housing in the elongated slot;
   wherein the mating housing is configured to be coupled to the second electrical connector as the second PCB is loaded in the board loading direction to move the mating housing relative to the receptacle housing in a connector loading direction along a connector loading axis parallel to the board loading direction, the cam lever engaging the second electrical connector and being actuated by the second electrical connector to force the mating housing to move within the receptacle housing in a connector mating direction along a connector mating axis perpendicular to the connector loading axis; and
   wherein the contacts of the electrical connector are mated with the contacts of the second electrical connector in a contact mating direction parallel to the connector mating axis.

8. The circuit card assembly of claim 7, wherein the mating housing slides axially along the movable pusher relative to the cam lever as the mating housing moves in the connector loading direction.

9. A communication system comprising:
a first circuit card assembly having a first printed circuit board (PCB) and a first electrical connector mounted to the first PCB, the first electrical connector having a first mating end and first contacts at the first mating end, each of the first contacts having a first mating interface, the first electrical connector having a receptacle housing and a mating housing received in the receptacle housing and being movable in the receptacle housing in a connector loading direction along a connector loading axis and being movable in the receptacle housing in a connector mating direction along a connector mating axis perpendicular to the connector loading axis; and
a second circuit card assembly having a second PCB and a second electrical connector mounted to the second PCB, the second electrical connector having a second mating end and second contacts at the second mating end, each of the second contacts having a second mating interface, the second electrical connector having a header housing holding the second contacts;
wherein at least one of the first PCB and the second PCB includes a slot receiving the other of the first PCB and the second PCB in a board loading direction along a board loading axis, the board loading axis being parallel to the connector loading axis;
wherein the receptacle housing is coupled to the header housing in the board loading direction as the first PCB and the second PCB are mated, and wherein the mating housing engages the header housing and moves with the header housing in the connector loading direction as the header housing moves in the board loading direction, and wherein the mating housing is movable within the receptacle housing toward the header housing in the connector mating direction generally perpendicular to the board loading direction as the header housing moves in the board loading direction.

10. The communication system of claim 9, wherein the header housing and the mating housing move together relative to the receptacle housing in the connector loading direction.

11. The communication system of claim 9, wherein the mating housing moves in the connector mating direction relative to the header housing while simultaneously moving with the header housing relative to the receptacle housing in the connector loading direction.

12. The communication system of claim 9, wherein the mating housing moves in the board loading direction with the header housing and is configured to move independent of the header housing in the connector mating direction.

13. The communication system of claim 9, wherein the header housing engages the mating housing to confine mating movement of the first contacts relative to the second contacts in a contact mating direction perpendicular to the board loading direction.

14. The circuit card assembly of claim 9, wherein the mating housing includes a stop wall configured to engage the header housing when the header housing is moving in the board loading direction to force the mating housing to move in the connector mating direction relative to the receptacle housing.

15. The circuit card assembly of claim 9, wherein the first electrical connector includes a cam lever pivotably coupled to the receptacle housing and pivotably coupled to the mating housing, the cam lever configured to engage the header housing to move the cam lever and force the mating housing to move relative to the receptacle housing in the connector mating direction.

16. The circuit card assembly of claim 9, wherein the first electrical connector includes a cam lever, the cam lever having a fixed pivot received in an opening in the receptacle housing and being pivotably coupled to the receptacle housing at a pivot axis, the cam lever having a movable pusher movable relative to the pivot axis, the movable pusher being received in a slot in the mating housing, the mating housing being driven in the connector mating direction by the movable pusher, the slot allowing the mating housing to slide parallel to the connector loading axis relative to the movable pusher as the mating housing is moved in the connector loading direction.

17. The communication system of claim 9, wherein the first electrical connector includes a cam lever pivotably coupled to the receptacle housing and pivotably coupled to the mating housing, the cam lever having a cam surface configured to engaging the header housing to move the cam lever and force the mating housing to move relative to the receptacle housing toward the header housing, the cam lever having a return cam surface configured to engage the header housing to move the cam lever and force the mating housing to move relative to the receptacle housing away from the header housing.

18. The communication system of claim 9, wherein the header housing includes a wall defining a cavity configured to receive the mating housing, the wall having an actuator engaging the first electrical connector to actuate and move the mating housing relative to the receptacle housing.

19. The communication system of claim 9, wherein either the first PCB or the second PCB is oriented horizontally and the other of the first PCB or the second PCB is oriented vertically.

20. The communication system of claim 9, wherein the first mating end is oriented perpendicular to the first PCB, and wherein the second mating end is oriented parallel to the second PCB.

* * * * *